(12) United States Patent
Shizukuishi

(10) Patent No.: US 7,154,549 B2
(45) Date of Patent: Dec. 26, 2006

(54) SOLID STATE IMAGE SENSOR HAVING A SINGLE-LAYERED ELECTRODE STRUCTURE

(75) Inventor: Makoto Shizukuishi, Miyagi-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 758 days.

(21) Appl. No.: 10/015,598

(22) Filed: Dec. 17, 2001

(65) Prior Publication Data

US 2002/0075391 A1  Jun. 20, 2002

(30) Foreign Application Priority Data

Dec. 18, 2000  (JP) .............................. 2000-383922
Dec. 26, 2000  (JP) .............................. 2000-395700

(51) Int. Cl.
*H04N 3/14* (2006.01)

(52) U.S. Cl. ...................... 348/315; 348/319; 257/232; 257/233; 257/246; 257/249

(58) Field of Classification Search ................ 348/315, 348/319; 257/232, 233, 246, 249
See application file for complete search history.

(56) References Cited

U.S. PATENT DOCUMENTS

| | | | | |
|---|---|---|---|---|
| 4,242,700 A | * | 12/1980 | Weimer | 348/275 |
| 4,441,123 A | * | 4/1984 | Ochi | 348/275 |
| 4,680,636 A | * | 7/1987 | Ooi | 348/317 |
| 4,810,619 A | * | 3/1989 | Pampalone et al. | 430/313 |
| 5,210,433 A | * | 5/1993 | Ohsawa et al. | 257/250 |
| 5,274,250 A | * | 12/1993 | Miyake et al. | 257/59 |
| 5,682,203 A | * | 10/1997 | Kato | 348/340 |
| 5,844,290 A | * | 12/1998 | Furumiya | 257/432 |
| 6,344,666 B1 | * | 2/2002 | Yamaguchi et al. | 257/98 |
| 6,606,124 B1 | * | 8/2003 | Hatano et al. | 348/311 |
| 6,618,087 B1 | * | 9/2003 | Hokari et al. | 348/311 |
| 6,806,904 B1 | * | 10/2004 | Kim | 348/315 |
| 6,822,682 B1 | * | 11/2004 | Kawajiri et al. | 348/315 |

* cited by examiner

*Primary Examiner*—Vivek Srivastava
*Assistant Examiner*—Chriss S. Yoder
(74) *Attorney, Agent, or Firm*—Arent Fox PLLC

(57) ABSTRACT

Provided is a CCD image sensor wherein driving power and power consumption are reduced without increasing unusable regions. Photodiodes are arranged in a honeycomb form. Each vertical charge-transfer channel is made in such a manner that invasion portions, which invade spaces between the respective photoelectric transducers in photoelectric transducer columns positioned at both sides thereof, and non-invasion portions are alternately and continuously arranged, and the channel extends in the vertical direction to meander between the photodiodes arranged in the honeycomb form. Transfer electrodes extending in the horizontal direction to pass between the photodiodes are formed on the semiconductor substrate as monolayer electrodes. By making the transfer electrodes as the monolayer electrodes in this way, multi-layered poly-silicon electrode structure becomes unnecessary.

15 Claims, 13 Drawing Sheets

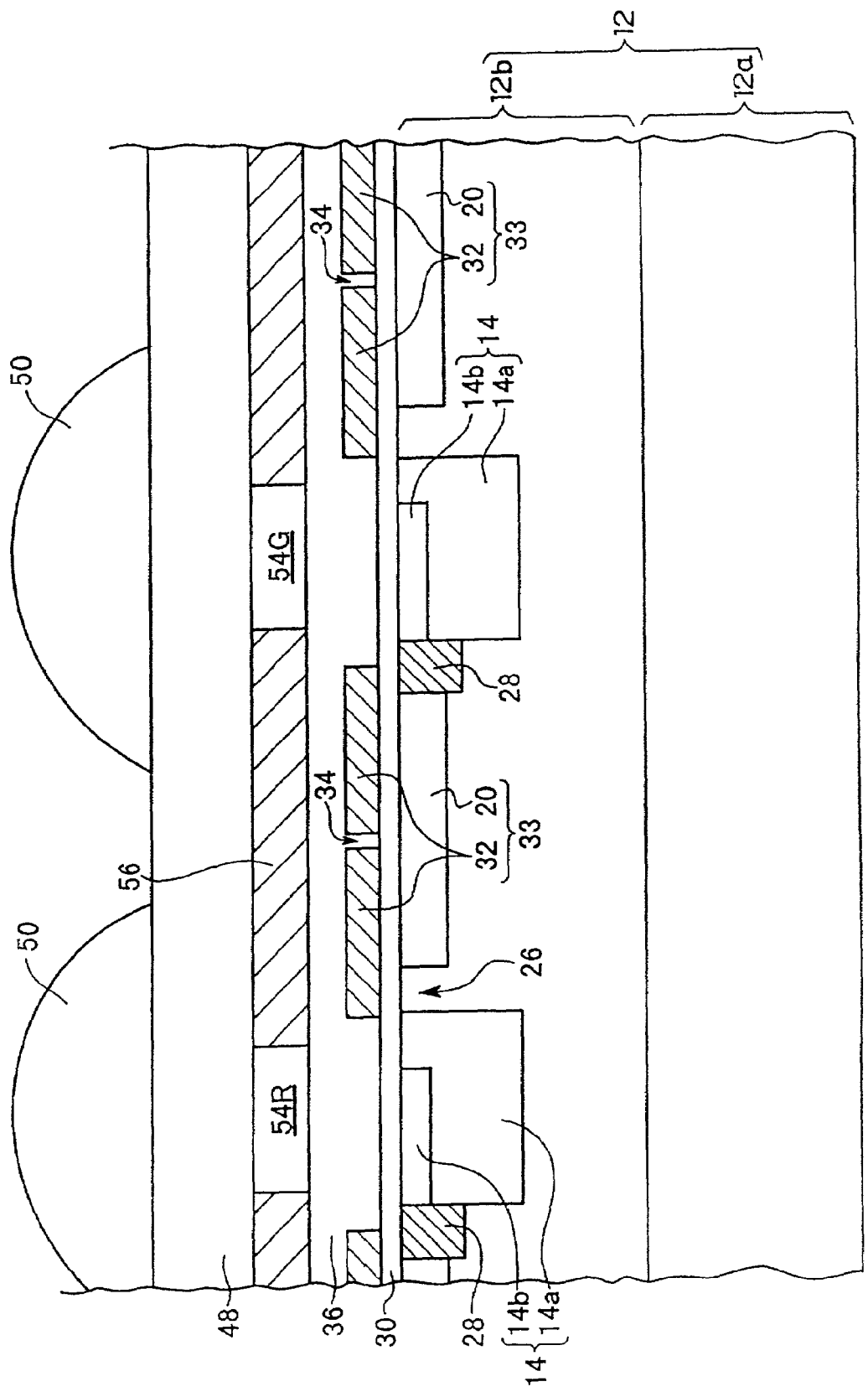

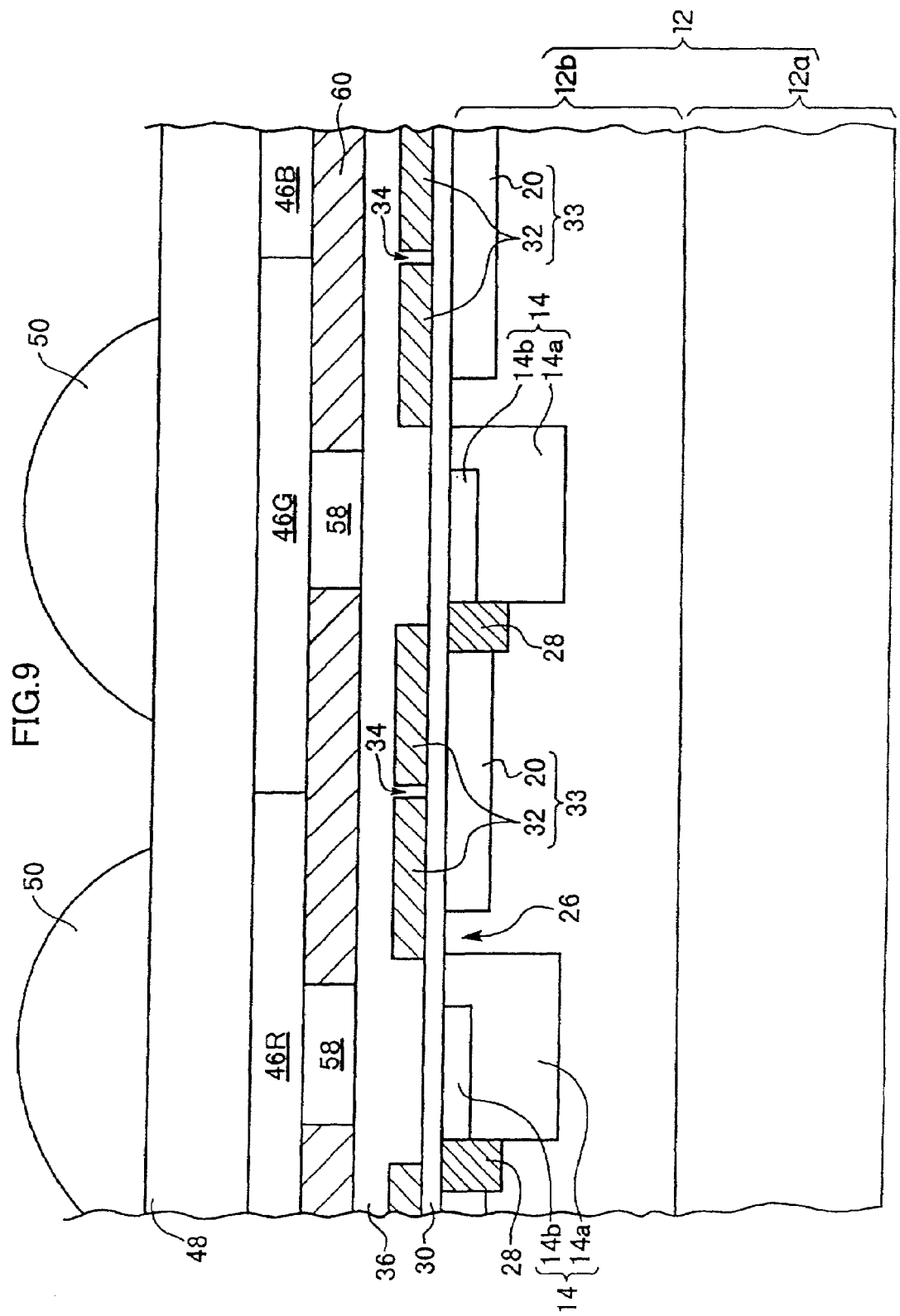

SOLID STATE IMAGE SENSOR HAVING A SINGLE-LAYERED ELECTRODE STRUCTURE

BACKGROUND OF THE INVENTION

Field of the Invention

The present invention relates to a solid state image sensor, particularly to a CCD (charge coupled devices) type solid state image sensor comprising a plurality of transducer column groups, each of which is composed of a photoelectric transducer column wherein a plurality of photoelectric transducers are disposed at given intervals in a given direction, and a photoelectric transducer column wherein a plurality of photoelectric transducers are disposed at the given intervals in the given direction, the second column being disposed to be shifted from the first column by a given amount in the given direction (CCD in a honeycomb arrangement).

Conventionally, a solid state image sensor has been developed to be used in a system adapted for a standard television system, for example, the so-called NTSC, wherein photographed images are displayed as moving images in a television or the like. In this standard television system, an interlace scanning technique is adopted to display moving images without flickering. Therefore, in CCD image sensors used in video camcoders or the like, many of which are called interline CCD image sensors, pixels are generally read out using an interlace scanning technique.

In recent years, the market for electronic still cameras have been rapidly expanding due to a rise in resolution of CCD sensors, a drop in costs thereof, a development of internet environment and popularization of personal computers. As with conventional film cameras, the electronic still cameras are also required to have the functions of recording highly minute still images and printing images having resolution as high as that of conventional silver halide photography. However, still images being photographed with an interlace scanning technique in an electronic still camera, a still image is composed of two field image data. Between these two fields, there is a time difference in reading out pixel signals. If an object to be photographed moves during the period, the outline of the captured still image is shifted.

In order to solve this problem, a mechanical shutter which works precisely is also used in an electric still camera to mechanically control the time for exposure and to prevent further light exposure in photodiode regions. By reading out photo-generated signals after the mechanical shutter is closed, image lag or slippage can be prevented.

In order to record still images, a CCD image sensor using a progressive scanning technique, which reads out all photo-generated signal in each pixel simultaneously, has been developed. This type of solid state image sensor does not require a highly precise mechanical shutter since all photo-generated carriers are simultaneously read out. The following will describe an interline CCD image sensor using a conventional progressive scanning technique with reference to FIGS. 12A–12C. As illustrated in FIG. 12A, this interline CCD image sensor has photodiodes 106 isolated from each other by channel stops 108, vertical charge-transfer registers (or vertical CCDs, V-CCDs) 100, and charge-transfer electrodes 102a, 102b and 102c (or vertical transfer electrodes) which are arranged in parallel to each other on the vertical charge-transfer registers 100 so as to be separated from the photodiodes 106 and to extend in the horizontal direction.

In order to perform progressive scanning, the charge-transfer electrodes 102a, 102b and 102c constitute one set of vertical CCD transfer electrodes 102 and are subjected to three-phase driving pulse. In the case that the three-phase driving is performed, in vertical pixels the charge-transfer electrodes 102a, 102b and 102c, which are arranged in parallel to each other, are formed into three multilayers which are electrically separated with insulating films 104, which may be polysilicon oxide films, as illustrated in FIG. 12B.

As illustrated in FIG. 12C, on the vertical charge-transfer registers 100, the charge-transfer electrodes 102a, 102b and 102c also overlap partially with each other to have the insulating layers 104 therebetween.

The reason why the charge-transfer electrodes are formed into a multilayer structure is as follows. The electrodes are electrically isolated from each other by the insulating films 104 such as polysilicon oxide films, so that the electrodes can be caused to come close to each other so as to keep "narrow gaps" therebetween, each of which has the same thickness as the insulating films 104, and electric charges can be smoothly moved in the charge-transfer registers.

As illustrated in FIGS. 12A and 12B, the space between the photodiodes 106 adjacent to each other in the vertical direction (the space between vertical pixels) is an isolation region, in which neither photodiode 106 nor vertical charge-transfer register 100 is present, and is the so-called "unusable region", which is used merely for wiring the transfer electrodes. However, by forming the charge-transfer electrodes into a multilayer, this unusable region can be made smaller.

However, the driving voltage of a CCD image sensor is higher than that of other solid state image sensors, for example, a MOS image sensor, and a driving voltage of 5 V or more is required to drive the CCD image sensor. This is because the gate oxide film of the CCD image sensor is formed to be thicker than that of the MOS image sensor. It is noted that in order to drive a plurality of transfer electrodes having a large capacitance at a high speed, a large amount of power is consumed.

In the CCD image sensor, each of the transfer electrodes is formed by patterning using plasma etching. However, the gate oxide film which is exposed by the plasma etching is damaged. Particularly in the case that the CCD image sensor has a multilayered electrode structure, for a two-layer electrode, the wafer process step of the plasma etching must be performed 2 times and for a three-layer electrode, this step must be performed 3 times. Thus, the plasma damage in the gate oxide film is induced. In order to reduce this damage of the gate oxide film, in the CCD image sensor, the thickness of the gate oxide film is made thicker (that is, 300–700 Å) than in conventional IC. In order to control the transfer of charges in the substrate over the thick gate oxide film, the driving voltage thereof must be made higher. This causes the driving voltage of the CCD image sensor to be higher than other solid state image sensors, for example, the MOS image sensor.

In the case that the a plurality of charge-transfer electrodes are made into a "monolayer or single story electrode structure", the insulating film interposed between layers in the multilayered electrode structure is unnecessary. Thus, the parasitic capacitance between the electrodes can be made smaller and further, the gate oxide thickness can be made thinner. In this case, therefore, the driving voltage of the CCD image sensor can be reduced to make the power consumption thereof lower than in the case of the multilayered electrode structure. In the case of the monolayer electrode structure, it is also necessary to form "uniform narrow gaps" between the electrodes. In recent years, it has become possible to form uniform narrow gaps having a width of about 0.1 to 0.3 μm between the electrodes by using anisotropic etching and lithographic technique.

However, in the case of the conventional CCD that the monolayer electrode structure is adopted, the number of electrodes per unit pixel increases, the unusable region between two pixels increases so that the light sensitivity thereof and the dynamic range thereof deteriorate. For example, in the case that in a CCD image sensor in a progressive scanning manner having V-CCD register which is driven in three phases and its charge-transfer electrodes are made into a monolayer electrode structure, additional area composed of [electrode width×3+ gap width×2]0 is required for the space between pixels so that the area of light-receiving areas is markedly reduced. It is therefore very difficult in the conventional progressive type CCD image sensor, to make the charge-transfer electrodes into a monolayer electrode structure.

Low-resistance polysilicon used as an electrode material transmits light. Therefore, it is necessary that the charge-transfer electrodes are completely shielded from incident light. However, in the case that the charge-transfer electrodes are formed into a multilayer, large steps are formed as illustrated in FIG. 12B. In the case that the multilayered electrode structure is adopted, the side faces of the multilayered electrodes having the unevenness must be covered with a light-shielding film. However, complete light-shielding is difficult. Thus, light transmitting through the charge-transfer electrodes generates photo-carriers in charge-transfer registers, which causes smear noise.

In order to cover not only the upper surface of the charge-transfer electrodes formed into the multilayer, but also the side walls thereof completely with the light-shielding film, a metal film which can be made thin, such as an aluminum (Al) film or a tungsten (W) film, is used as the light-shielding film. In the case that the light-shielding film is made of such a conductive material, it is necessary that an insulating film which does not allow electrical leakage between the charge-transfer electrode and the light-shielding film. As the insulating film, a polysilicon oxide film and passivation film formed to have a thickness of 2000 Å is usually used. However, electrical capacitance between the charge-transfer electrode and the light-shielding film increases parasitic capacitance. Thus, in the case that the CCD image sensor is driven at a high speed, this large parasitic capacitance results in the generation of noise or an increase in power consumption.

SUMMARY OF THE INVENTION

In light of the above-mentioned problems, the present invention has been made. Thus, an object of the present invention is to provide a CCD image sensor wherein driving voltage and power consumption are reduced without decreasing photo-sensitivity and in which smear noise is reduced.

In order to achieve the above-mentioned object, a first aspect of the present invention provides a solid state image sensor, comprising a plurality of transducer column groups, each of which is composed of a first photoelectric transducer column wherein a plurality of photoelectric transducers are disposed at given intervals in a given direction, and a second photoelectric transducer column wherein a plurality of photoelectric transducers are disposed at said given intervals in the said direction, the second column being disposed so as to be shifted from the first column by a given amount in said given direction, wherein transfer registers are disposed between the respective photoelectric transducer columns so as to invade spaces between the respective photoelectric transducers in the photoelectric transducers columns adjacent to each other and so as not to contact each other, the solid state image sensor further comprising a plurality of monolayer electrodes which pass between the photoelectric transducers and extend in a direction that intersects said given direction, and which are arranged so as to be a given distance apart from each other in such a manner that signal charges generated in the photoelectric transducers are transferred along the transfer registers.

In the solid state image sensor of the first aspect of the present invention, the transfer registers are arranged between the respective photoelectric transducer columns so as to invade the spaces between the respective photoelectric transducers in the photoelectric transducers columns adjacent to each other and so as not to contact each other. Therefore, the spaces between the respective photoelectric transducers are effectively used as the transfer registers. Therefore, even if the a plurality of monolayer electrodes extending to pass between the photoelectric transducers and cross the given direction are arranged at given intervals so as to transfer the signal charges generated in the photoelectric transducers along the transfer registers, the so-called unusable region, which only electrode wiring occupies, is not generated. Thus, the area of light-receiving areas is not reduced. By making the transfer electrodes monolayer electrodes, disposing insulating films between the electrode layers in a multilayer electrode structure becomes unnecessary. Thus, driving voltage and power consumption of the solid state image sensor can be made lower than in the case of the multilayer electrode structure.

In the above-mentioned solid state image sensor, by making the interval or space between the monolayer electrodes above the transfer registers narrower than the interval between the monolayer electrodes above isolating regions for isolating the transfer registers adjacent to each other electrically, the flow of charges in the transfer registers becomes smooth. By forming the interval between the monolayer electrodes above the transfer registers linearly from one side edge of the transfer registers toward the other side edge thereof, the flow of charges becomes smoother.

As described above, insulating films between the electrodes in multiplayer electrode structure become unnecessary. The flexibility in selecting the material of the electrodes is increased. The monolayer electrodes may be made of, for example, a metal other than polysilicon, such as aluminum or copper. In this case, optical surface-treatment is preferably conducted in order to make the reflectivity of the electrode surfaces smaller than that of metal aluminum itself (for example, 50% or less of the surface reflectivity of metal aluminum itself). As the electrode material, the following group can be selected: the group consisting of low-resistance polysilicon, tungsten, molybdenum, tungsten silicide, molybdenum silicide, titanium silicide, tantalum silicide and copper silicide.

The monolayer electrode is an electrode made of a single layer. The monolayer electrodes may be formed by stacking a plurality of electrode materials selected from the group consisting of low-resistance polysilicon, tungsten, molybdenum, tungsten silicide, molybdenum silicide, titanium silicide, tantalum silicide and copper silicide.

In order to achieve the above-mentioned object, a second aspect of the present invention provides a solid state image sensor, wherein a plurality of photoelectric transducer columns having a plurality of photoelectric transducers disposed in a given direction at given intervals, are arranged in parallel, and transfer registers are disposed between the respective photoelectric transducer columns, the solid state image sensor further comprising a plurality of monolayer electrodes which pass between the photoelectric transducers and extend in a direction that intersects the given direction, and which are disposed to sandwich given gaps therebetween in such a manner that signal charges generated in the photoelectric transducers are transferred along the transfer registers, and a nonconductive light-shielding film formed above the monolayer electrodes and having light-transmitting portions through which light received in light-receiving areas of the photoelectric transducers is transmitted.

Since the transfer electrodes are composed of the monolayer electrodes in the second aspect of the present invention, unevenness in the surface of the image pickup section of the solid state image sensor is reduced. Thus, the surface can easily be made flat and smear noise is markedly overcome. Disposing insulating films between electrode layers in a multilayer electrode structure becomes unnecessary and thus parasitic capacitance can be reduced. Thus, driving voltage is reduced so that power consumption can be made lower than in the case of the multilayer electrode structure. Furthermore, the monolayer electrodes have a small difference in step level, so that it is unnecessary to shield the side walls of the electrodes. Therefore, it is also unnecessary to use a metal thin film made of Al, W or the like as a light-shielding film. Thus, a nonconductive material can be used as the light-shielding film. By making light-shielding film nonconductive, parasitic capacitance between the transfer electrodes and the light-shielding film can made smaller. Thus, power consumption and noise can be reduced.

A third aspect of the present invention provides a solid state image sensor, comprising a plurality of transducer column groups arranged in parallel, each of which is composed of a first photoelectric transducer column wherein a plurality of photoelectric transducers are disposed at given intervals in a given direction, and a second photoelectric transducer column wherein a plurality of photoelectric transducers are disposed at said given intervals in said given direction, the second column being disposed to be shifted from the first column by a given amount in said given direction, wherein transfer registers are disposed between the respective photoelectric transducer columns so as to invade spaces between the respective photoelectric transducers in the photoelectric transducers columns adjacent to each other and so as not to contact each other, the solid state image sensor further comprising a plurality of monolayer electrodes which pass between the photoelectric transducers to extend in a direction which intersects said given direction, and which are disposed to sandwich given gaps therebetween in such a manner that signal charges generated in the photoelectric transducers are transferred along the transfer registers, and a nonconductive light-shielding film formed above the monolayer electrodes and having light-transmitting portions through which light received in light-receiving areas of the photoelectric transducers is transmitted.

In the third embodiment of the present invention, the transfer registers are arranged between the respective photoelectric transducer columns so as to invade the spaces between the respective photoelectric transducers in the photoelectric transducers columns adjacent to each other and so as not to contact each other. For this reason, the spaces between the respective photoelectric transducers are effectively used as the transfer registers. Therefore, even if the a plurality of monolayer electrodes passing between the photoelectric transducers to extend so as to cross the given direction are arranged to sandwich given gaps therebetween in such a manner that the signal charges generated in the photoelectric transducers are transferred along the transfer registers, unusable regions which are only occupied by electrode wiring are not generated and thus the area of the light-receiving areas is not reduced.

Since the transfer electrodes are composed of the monolayer electrodes, the unevenness in the surface of the image pickup section of the solid state image sensor is reduced so that the surface can easily be made flat and smear noise is markedly reduced. Moreover, any insulating film disposed between layers in a multilayer electrode structure becomes unnecessary so that parasitic capacitance can be reduced. Thus, in this case, the driving voltage and power consumption can be made lower than in the case of the multilayer electrode structure. Since the monolayer electrodes have a small difference in step level and thus it is unnecessary to shield the side walls of the electrodes, it is unnecessary to use a metal thin film made of Al, W or the like as the light-shielding film. Thus, a nonconductive material can be used for the light-shielding film. By making the light-shielding film nonconductive, parasitic capacitance between the transfer electrodes and the light-shielding film can be made smaller. As a result, power consumption and noise can be reduced.

The nonconductive light-shielding film is formed on the monolayer electrodes, or may be formed on a flattening film over the monolayer electrodes. In the case that the nonconductive light-shielding film is formed on the flattening film over the monolayer electrodes, light-transmitting portions, through which light having a given wavelength received in the light-receiving areas of the photoelectric transducers is transmitted, and light-shielding portions surrounding the light-transmitting portions may be arranged in the same plane of the nonconductive light-shielding film. A filter layer through which the light having the given wavelength is transmitted may be formed above or below the nonconductive light-shielding film.

In the above-mentioned solid state image sensor, all or a part of the edge portions of the nonconductive light-shielding film may be extended toward the center of the light-receiving areas of the photoelectric transducers. In this case, smear noise is reduced even further.

The nonconductive light-shielding film can be made of a resin material. As the resin material, a resin containing a photosensitive resin or gelatin is preferred. In order to give light-shielding ability to the nonconductive material made of the photosensitive resin or gelatin or the like, carbon powder or various pigments which absorb or reflect light are dispersed into the nonconductive material or the conductive material is dyed with a dye which absorbs or reflects light.

In the light-transmitting portions ("the opening"), through which light received in the light-receiving areas of the photoelectric transducers is transmitted, the opening near the periphery of the image sensor is located off center from that near the center of the device For example, the central position of the opening may be located off from the central positions of the photoelectric transducers. By making the central positions of the openings different from the central positions of the photoelectric transducers, incident light can be effectively introduced into the light-receiving areas. Thus, uniformity in sensitivity of the solid state image sensor is improved. By making optical axis of microlenses arranged above the light-shielding film located off from the central positions of the photoelectric transducers in the same way as the central positions of the openings, uniformity in sensitivity of the solid state image sensor is improved even more. The opening may be a polygon having four sides or more, a circular shape or an elliptic shape.

BRIEF DESCRIPTION OF THE DRAWINGS

FIG. 8 is a sectional view of a CCD image sensor according to a fifth embodiment.

FIG. 9 is a sectional view of a CCD image sensor according to a sixth embodiment.

DESCRIPTION OF THE PREFERRED EMBODIMENTS

Figure 1:
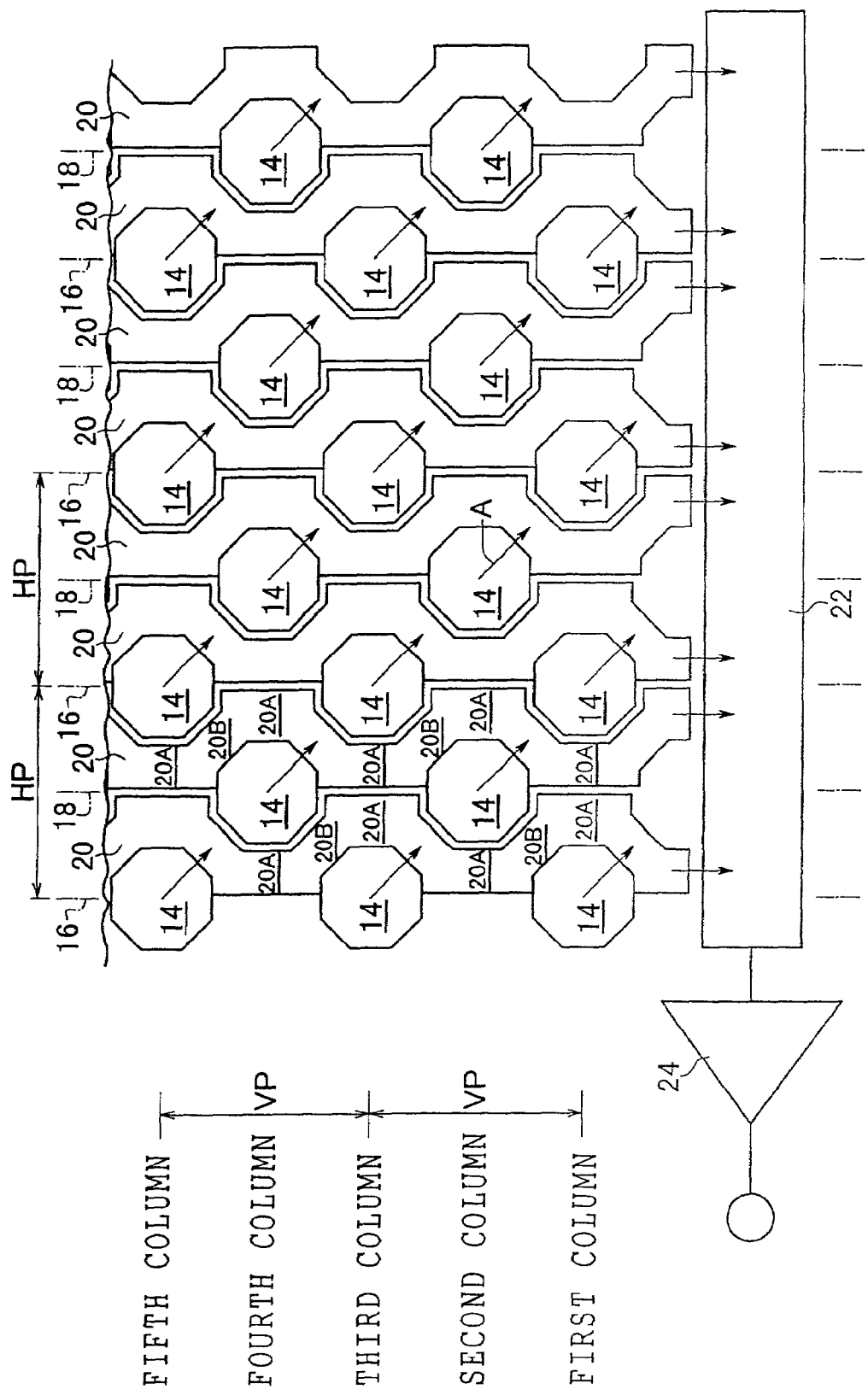
FIG. 1 is a view which schematically illustrates a CCD image sensor according to a first embodiment.

Referring to the drawings, embodiments of the present invention will be described in detail hereinafter.

First Embodiment

As illustrated in FIG. 1, a CCD image sensor according to a first embodiment of the present invention is made in such a manner that a plurality of transducer column groups, each of which is composed of the following, are disposed in the horizontal direction on a semiconductor substrate (not illustrated): a first photoelectric transducer column 16 wherein photodiodes 14 which are photoelectric transducers are disposed at given intervals (vertical pixel pitch VP) in the vertical direction; and a second photoelectric transducer column 18 wherein photodiodes 14 are disposed at the same intervals as in the first photoelectric transducer column 16 in the vertical direction, and are disposed to be shifted, by ½ of the vertical pixel pitch VP, from the first photoelectric transducer column 16 into the vertical direction.

The adjacent first photoelectric transducer columns 16, as well as the adjacent second photoelectric transducer columns 18 are disposed at the interval (horizontal pixel pitch HP) equal to the vertical pixel pitch. Photoelectric transducer rows composed of the photodiodes 14 included in the first photoelectric transducer columns 16 are disposed to be shifted by ½ of the horizontal pixel pitch HP from photoelectric transducer rows composed of the photodiodes 14 included in the second photoelectric transducer columns 18 into the horizontal direction. That is, the photodiodes 14 are arranged in the so-called honeycomb.

A vertical charge-transfer channel 20 for reading out signal charges generated in the photodiode 14 and transferring the charges in the vertical direction is disposed between the first photoelectric transducer column 16 and the second photoelectric transducer column 18 which are disposed so as to be close to each other. The vertical charge-transfer channel 20 is made in such a manner that invasion portions 20A, which invade spaces between the respective photodiodes in the photoelectric transducer columns positioned at both sides thereof, and non-invasion portions 20B are alternately and continuously arranged, and the channel 20 extends in the vertical direction to meander between the photodiodes 14 arranged in the honeycomb form. A channel stop 28, which will be described later, is arranged between the invasion portions 20A adjacent to each other, so that the vertical charge-transfer channels 20 do not contact each other. As a result, the substantial whole of the peripheral areas of the photodiodes 14, except the channel stops 28, are used as the vertical charge-transfer channels 20 so that "unusable regions", which are used only for wiring transfer electrodes, are not generated. In this respect, the present embodiment is entirely different from conventional interline CCDs. In the present embodiment, the peripheral areas of the photodiodes 14 are more effectively used than in the conventional interline CCDs.

The downstream end portion of each of the vertical charge-transfer channel 20 in the transferring direction is connected to a horizontal charge-coupled device (HCCD) 22 for transferring signal charges transferred from the vertical charge-transfer channel 20 in the horizontal direction, and transfer electrodes of this HCCD 22 have a monolayer electrode structure in the same way as in a vertical charge-transfer device 33, which will be described later. The downstream end portion of each of the HCCD 22 in the transferring direction is connected to an output section 24 for outputting a voltage corresponding to the charge amount of the signal charges.

Figure 2:
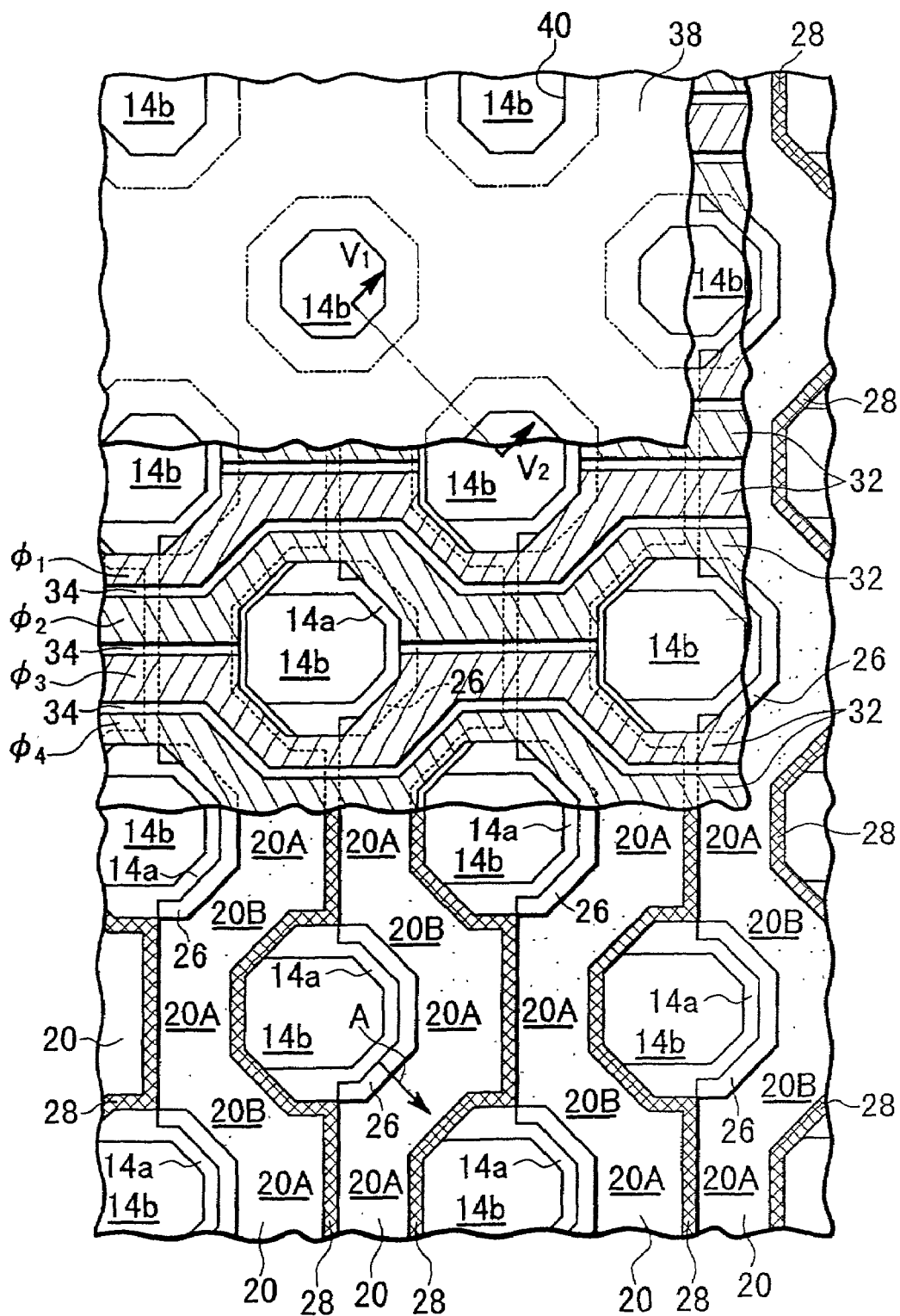
FIG. 2 is a partially enlarged plan view of an image pickup section of the CCD image sensor according to the first embodiment.
Figure 3:
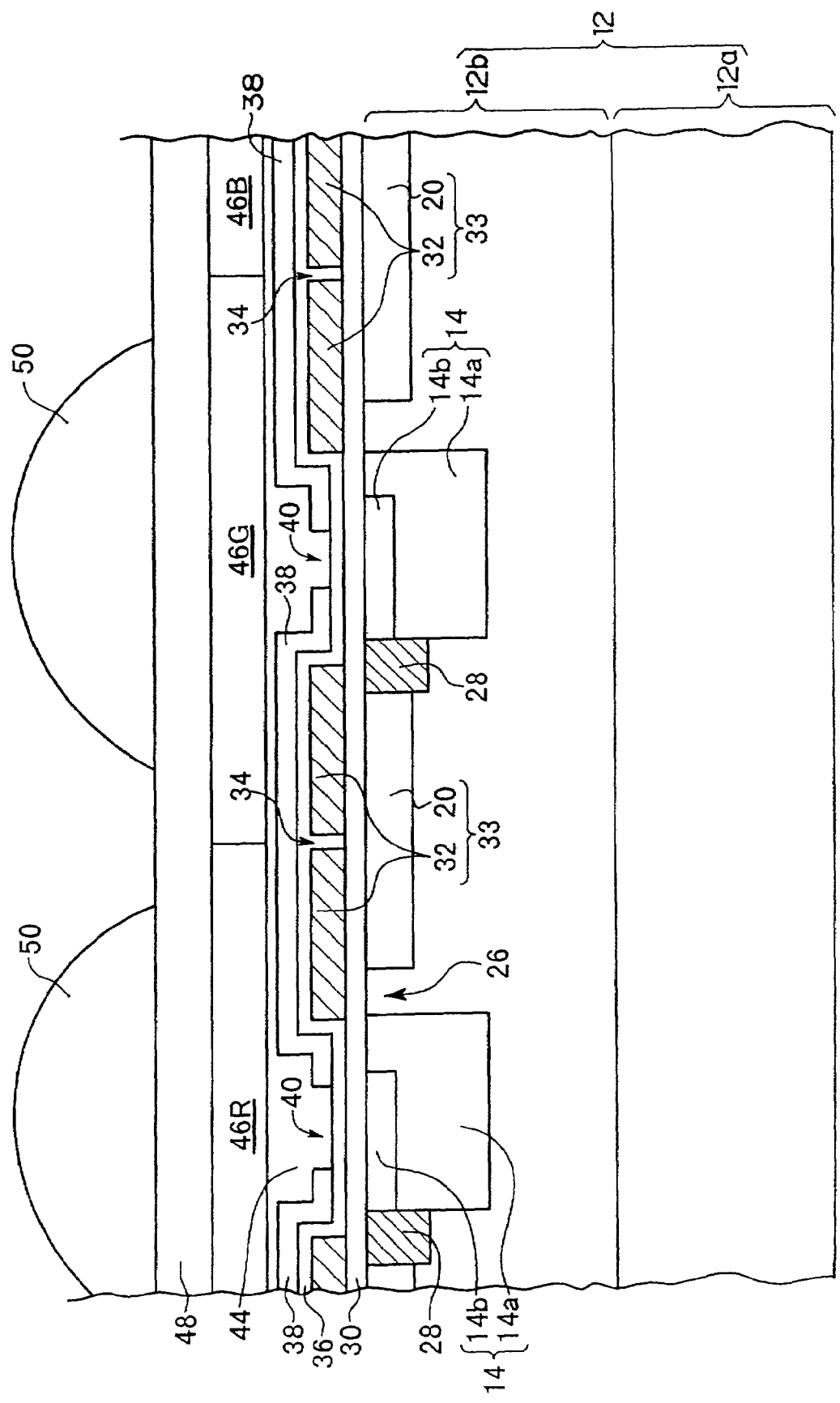
FIG. 3 is a sectional view taken along line V1–V2 of the image pickup section illustrated in FIG. 2.

FIG. 2 is a partially enlarged view illustrating a structure wherein microlenses, color filters and so on are removed from an image pickup section of the CCD image sensor according to the present embodiment, and FIG. 3 is a sectional view taken along line V1–V2 of FIG. 2, to which are added microlenses, color filters and so on. As illustrated in FIGS. 2 and 3, a semiconductor substrate 12 is composed of an n-type semiconductor substrate 12a of silicon and a p-type impurity-doped region (p-well) 12b.

The photodiodes 14 are formed as photodiodes embedded in this p-type impurity-doped region 12b. As described above, the photodiodes 14 are composed of n-type impurity-doped regions 14a functioning as charge-accumulating regions, and p⁺-type impurity-doped regions 14b formed on the n-type impurity-doped regions 14a.

Each of the vertical charge-transfer channels 20 is formed as an n-type impurity-doped region in the p-type impurity-doped region 12b. A channel 26 for a readout gate, which is made of the p-type impurity-doped region is disposed between the vertical charge-transfer channel 20 and the photodiode 14 for sending out signal charges to this vertical charge-transfer channel 20. Along this readout gate channel 26, an n-type impurity-doped region 14a is exposed at the surface of the semiconductor substrate 12. Signal charges generated in the photodiode 14 are temporarily accumulated in the n-type impurity-doped region 14a, and are then sent out through the readout gate channel 26, for example, in the direction of an arrow A.

On the other hand, a channel stop 28, which is a p$^+$-type impurity-doped region, is disposed between the vertical charge-transfer channel 20 and other photodiodes 14. The vertical charge-transfer channel 20 is electrically separated from the photodiodes 14 by this channel stop 28, and further the vertical charge-transfer channel 20 is separated from any other vertical charge-transfer channels 20 so that they do not contact each other.

Transfer electrodes 32 are formed on a gate oxide film 30 above the surface of the semiconductor substrate 12 to extend in the horizontal direction, so that each of the electrodes 32 passes between the photodiodes. The transfer electrodes 32 are formed in such a manner that the readout gate channels 26 are covered and n-type impurity-doped regions 14a and a part of each of the channel stops 28 are exposed. Signal charges are transferred from the readout gate channels 26 which are present under the electrodes to which, readout voltages are applied.

Each of the transfer electrodes 32 is combined with the vertical charge-transfer channel 20 to constitute a vertical charge-coupled device (VCCD) 33 for transferring signal charges generated in the photodiode 14 in the vertical direction. The VCCD 33 is subjected to four-phase driving ($\phi1$–$\phi4$), and is composed of a group of four transfer electrodes 32 which are driven in phases different from each of the photodiodes 14. A plurality of the VCCDs 33 are disposed in the vertical direction, so that the signal charges generated in the photodiode 14 are transferred in the vertical direction. The respective transfer electrodes 32, which are driven in different phases, are composed of monolayer electrodes formed on the same plane. A narrow gap (interval between the transfer electrodes in the arrangement direction thereof) 34 is present between each of the monolayer electrodes. By making such monolayer transfer electrodes, the gate oxide film can be made thin and any insulating film disposed between layers in a multilayer electrode structure can be made unnecessary. Thus, its parasitic capacitance can be made lower than that of the multilayer electrode structure. As a result, driving power and power consumption can be reduced. As described above, the peripheral areas of the photodiodes 14 are used as the vertical charge-transfer channels 20 so that "unusable regions" other than the channel stops 28 are not generated. Therefore, even if the transfer electrodes 32 are made into a monolayer electrode structure, the area of light-receiving portions is not reduced.

Each of the gaps 34 is formed by making horizontal gap portions extending in the horizontal direction, and oblique gap portions disposed between the horizontal gap portions and extending in an oblique direction and then causing these respective portions to be continuous with each other. The size of the gaps 34, that is, the distance between the transfer electrodes 32 is constant in all the portions, and is preferably about 0.3 µm or less, more preferably from about 0.1 to about 0.2 µm in order to make the flow of charges smooth.

The transfer electrodes 32 can be made of any electrode material that is generally used in the process for manufacturing semiconductor or solid-state devices. By making the transfer electrodes 32 into a monolayer electrode structure, any insulating film for insulating electrode layers from each other (high-resistance silicon oxide film) becomes unnecessary so that the flexibility in selecting the electrode material becomes great. Also, the flexibility in the configuration of the electrode, such as width or thickness thereof, increases in accordance with the electrode material used.

It is also possible that the monolayer electrodes are made of substances other than polysilicon. They may be made of metals such as aluminum or copper for example. However, if the surfaces of the electrodes have a high reflectivity, an undesirable effect caused by halation is produced in the photolithographic step in the manufacturing process thereof or reflective light becomes unnecessary stray light between the electrodes and a CCD package or an optical lens system. As a result, the quality of photographed images may be lowered. For this reason, the electrodes are preferably subjected to surface treatment in order to make the reflectivity of the electrode surfaces lower than surface reflectivity of metal aluminum itself (for example, 50% or less of the surface reflectivity of metal aluminum itself). By using an electrode material having light-shielding ability, for example, a light absorbent material, an effect of shielding unnecessary incident light from the outside can be expected. In the case that impurities are contained even in a very small amount, the gate oxide film or the silicon substrate are contaminated so that image defects, such as pixel defects or white spots, may be induced. Therefore, it is desired to use an electrode material having a low electrical resistance and a high purity.

As the electrode material having a reflectivity lower than aluminum, preferred are low-resistance materials such as low-resistance polysilicon, low-resistance metals and various silicides. Examples thereof include low-resistance polysilicon, tungsten (W), molybdenum (Mo), tungsten silicide (WSi), molybdenum silicide (MoSi), titanium silicide (TiSi), tantalum silicide (TaSi), and copper silicide (CuSi). Tungsten has a reflectivity of 50% or less of that of aluminum against light having a wavelength of 500 nm. The transfer electrodes 32 may be formed by laminating layers made of any one of these electrode materials without interposing any insulating film between the layers.

The surface of the semiconductor substrate 12, on which the transfer electrodes 32 are formed, is covered with a surface protective film 36 made of a transparent resin or the like. A light-shielding film 38 is formed on this surface protective film 36. The light-shielding film 38 has an opening 40, corresponding to each of the photodiodes 14, as a light transmitting portion (through which light received in the p+ type impurity-doped region 14b, which is a light-receiving region, is transmitted). The opening 40 has, for example, an octagonal shape. The edge portion of the light-shielding film 38 extends toward the centers of the light-receiving regions, so that the shape of the openings for the photodiodes 14 is determined by the light-shielding film 38.

The light-shielding film 38 is made of a nonconductive material such as a resin material. As the resin material, a resin containing a photosensitive resin or gelatin as a main base is preferred. There may be used, for example, a resin material to which light-shielding ability is given, for example, by dispersing a pigment which absorbs or reflects visible rays into the resin or by dying the resin with a dye which absorbs or reflects visible rays. Preferably, a light-absorbent (low-reflectivity) material is preferred. There may be used, for example, a resin material wherein a black pigment is dispersed in a resin, or a resin material wherein a resin is dyed with a black dye. The openings 40 can be made by forming a resist mask on light-shielding portions of a thin film made of a nonconductive material by patterning, and then removing the nonconductive material by etching using this resist mask.

A color film array having red (R) filters 46R, green (G) filters 46G and blue (B) filters 46B is formed, across a flattening film 44 made of a transparent resin, above the light-shielding film 38 and the surface protective film 36 naked from the light-shielding film 38. The R filters 46R, the G filters 46G and the B filters 46B are arranged in a given pattern corresponding to the individual photodiodes 14. Detailed description of the arrangement pattern of the color filters is omitted. In FIG. 3, one of the R filters 46R, one of the G filters 46G and one of the B filters 46B are illustrated. Such a color filter array can be produced, for example, by forming areas of resins into which dyes or pigments having desired colors are incorporated (color resins) at given positions by photolithography or the like.

A microlens array having microlenses 50 is formed on the color filter array with the flattening film 48 therebetween. The microlenses 50 are arranged correspondingly to the individual photodiodes 14. These microlenses 50 can be formed, for example, by dividing a layer made of a transparent resin (including the photoresist) having a reflective index of about 1.3 to 2.0 into sections having a desired shape using photolithography, melting the transparent resin layer in the respective sections by heat treatment, making the corners thereof round by applying surface tension, and then cooling the resin layer.

As described above, in the CCD image sensor according to the present embodiment, the transfer electrodes are made into monolayer electrodes. Therefore, any insulating film disposed between layers in a multilayer electrode structure becomes unnecessary. In this way, parasitic capacitance can be reduced. In this case, therefore, driving voltage can be made lower than in the multilayer electrode structure. As a result, power consumption can be reduced.

It is unnecessary to use a metal thin film made of Al, W or the like for the light-shielding film. This is particularly because the monolayer electrodes have only small difference in step level so that it is unnecessary to shield light to side walls of the electrodes. For this reason, a nonconductive material can be used for the light-shielding film and the parasite capacitance between the electrodes and the light-shielding film can be ignored. As a result, power consumption and noise can be reduced.

By making the transfer electrodes as the monolayer electrodes, unevenness is reduced in the surface of the image pickup section of the CCD image sensor, particularly the surface before the microlenses and the color filters are deposited. Thus, the surface can easily be made flat and light-focusing efficiency is improved and smear noise is reduced.

Each of the vertical charge-transfer channels extends in the vertical direction while meandering between the photoelectric transducers arranged in a honeycomb form in such a manner that the channel invades spaces between the photoelectric transducers of the photoelectric transducer columns arranged at both side thereof. Therefore, the peripheral areas of the photoelectric transducers (for example, areas between pixels in the horizontal and vertical directions, areas between pixels along the direction of an angle of 45° to the horizontal direction, and so on) are used as the vertical charge-transfer channels. Thus, no "unusable regions", which are used only for wiring of the transfer electrodes, are generated. Accordingly, even if the transfer electrodes are made into a monolayer electrode structure, the area of the light-receiving portions is not reduced. As a result, increasing the number of pixels of the CCD image sensor and minaturization of the pixels are not hindered. Thus, the present embodiment can be applied to a CCD image sensor, especially in a progressive type CCD, which can read out all pixels at the same time.

With a multilayer electrode structure, there remains a problem that yield thereof drops on the basis of leakage current between its layers. However, in the case of the monolayer electrode structure, such a problem does not occur. In the case of the multilayer electrode structure, there also arises a problem that crystal defects are induced by the step of oxidizing polysilicon thermally at high temperature to form an insulating film. However, by adopting the monolayer electrode structure, the step of oxidizing polysilicon thermally at high temperature is unnecessary so that the generation of crystal defects are suppressed. As a result, white spots in re-produced images, which are a problem in any solid state image sensors, can be reduced. Furthermore, the monolayer electrode structure can be produced in fewer steps than the multilayer electrode structure. Accordingly, the process for producing a CCD image sensor can be made simpler.

In the case that an electrode material having light-shielding ability (tungsten or the like) is used for the transfer electrodes, the electrode material having light-shielding ability is arranged near the silicon substrate. Thus, an effect of shielding unnecessary incident light from the outside can be expected.

The color filter array is formed above the light-shielding film. That is, the color filters are arranged apart from the photoelectric transducers. It is therefore unnecessary to form the color filters in a precise manner.

Second Embodiment

A CCD image sensor according to a second embodiment of the present invention is the same as the CCD image sensor according to the first embodiment except that a pattern constituting the transfer electrodes 32 is different. Thus, the same reference numbers are assigned to the same elements, and the description thereof is omitted. Only different points will be described.

Figure 4:
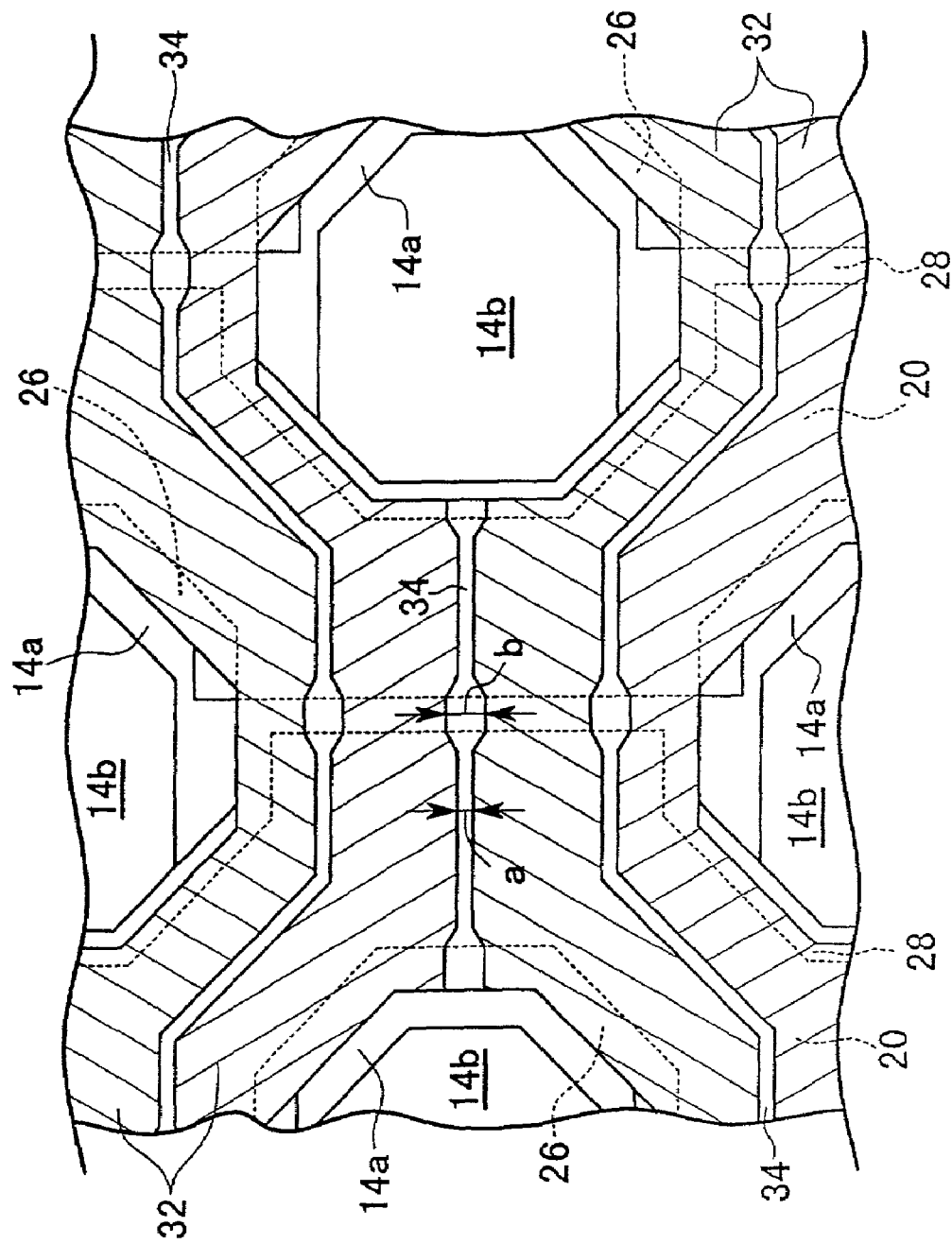
FIG. 4 is a partially enlarged plan view of an image pickup section of a CCD image sensor according to a second embodiment.

As illustrated in FIG. 4, in this CCD image sensor, the gap 34 between the transfer electrodes 32 adjacent to each other is formed so as to be narrow (a narrow gap a) on the vertical charge-transfer channel 20 and wide (a wide gap b) on the channel stop 28. The width of the narrow gap a is preferably set to about 0.3 µm or less and is more preferably set to about 0.1 to about 0.2 µm, in order to make the flow of charges smooth. The width of the wide gap b is preferably set to more than about 0.3 µm in order to prevent a short circuit between the transfer electrodes 32. The width is more preferably set into the range of about 0.3 to about 0.4 µm in order that trouble is not caused when the electrodes are formed in the device.

Since the transfer electrodes 32 above the vertical charge-transfer channels 20 are involved with the transfer of charges, the flow of the charges in the transfer register becomes smooth by making the gap 34 between the transfer electrodes 32 narrow. Since the transfer electrodes 32 above the portions other than the vertical transfer channels are not involved with the transfer of the charges, trouble due to a short circuit between the transfer electrodes 32 is prevented by making the gap 34 between the transfer electrodes 32 wide.

Third Embodiment

A CCD image sensor according to a third embodiment of the present invention is the same as the CCD image sensor according to the first embodiment except that a pattern constituting the transfer electrodes 32 is different. Thus, the same reference numbers are assigned to the same elements, and the description thereof is omitted. Only different points will be described.

Figure 5:
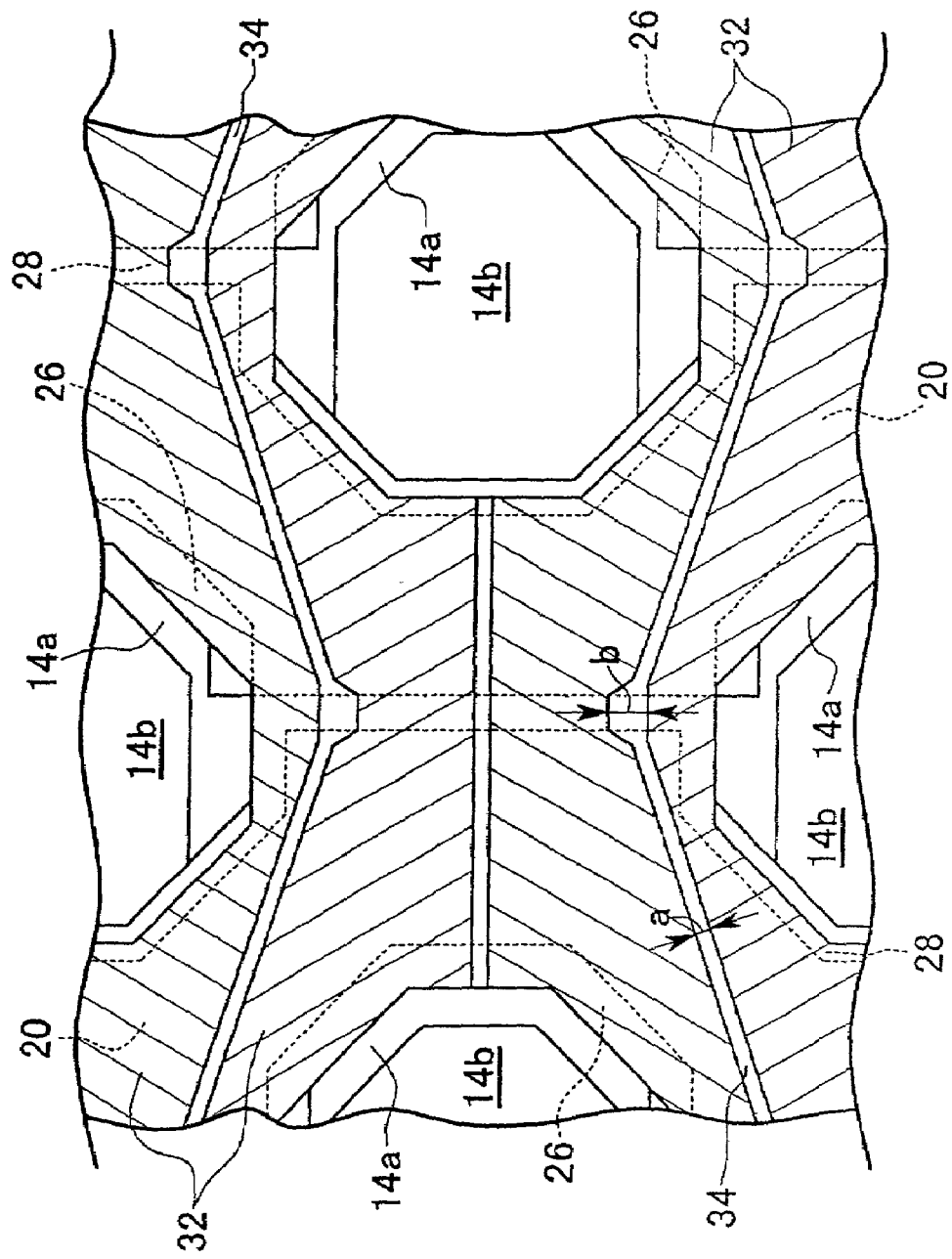
FIG. 5 is a partially enlarged plan view of an image pickup section of a CCD image sensor according to a third embodiment.

As illustrated in FIG. 5, in this CCD image sensor, the gap 34 between the transfer electrodes 32 adjacent to each other is formed so as to be narrow (a narrow gap a) on the vertical charge-transfer channel 20 and becomes wide (a wide gap b) on the channel stop 28 in the same way as in the second embodiment. Moreover, the gap 34 is formed to extend linearly from one side edge of the vertical charge-transfer channel 20 toward the other side edge thereof. The sizes of the narrow gap a and the wide gap b are the same as in the second embodiment.

By making the gap 34 between the transfer electrodes 32 in this way, the flow of charges in the vertical charge-transfer channel 20 becomes smooth. Thus, coupling capacitance between the transfer electrodes 32 is reduced so that noise and power consumption are reduced. The gap 34 is narrow on the vertical charge-transfer channel 20; however, by making the gap 34 to extend linearly, a precise gap pattern is easily formed. Thus, a short circuit trouble between the transfer electrodes 32 is prevented.

Fourth Embodiment

A CCD image sensor according to a fourth embodiment of the present invention is the same as the CCD image sensor according to the first embodiment except that the transfer electrodes 32 are made of a plurality of electrode materials. Thus, the same reference numbers are assigned to the same elements, and the description thereof is omitted. Only different points will be described.

Figure 6:
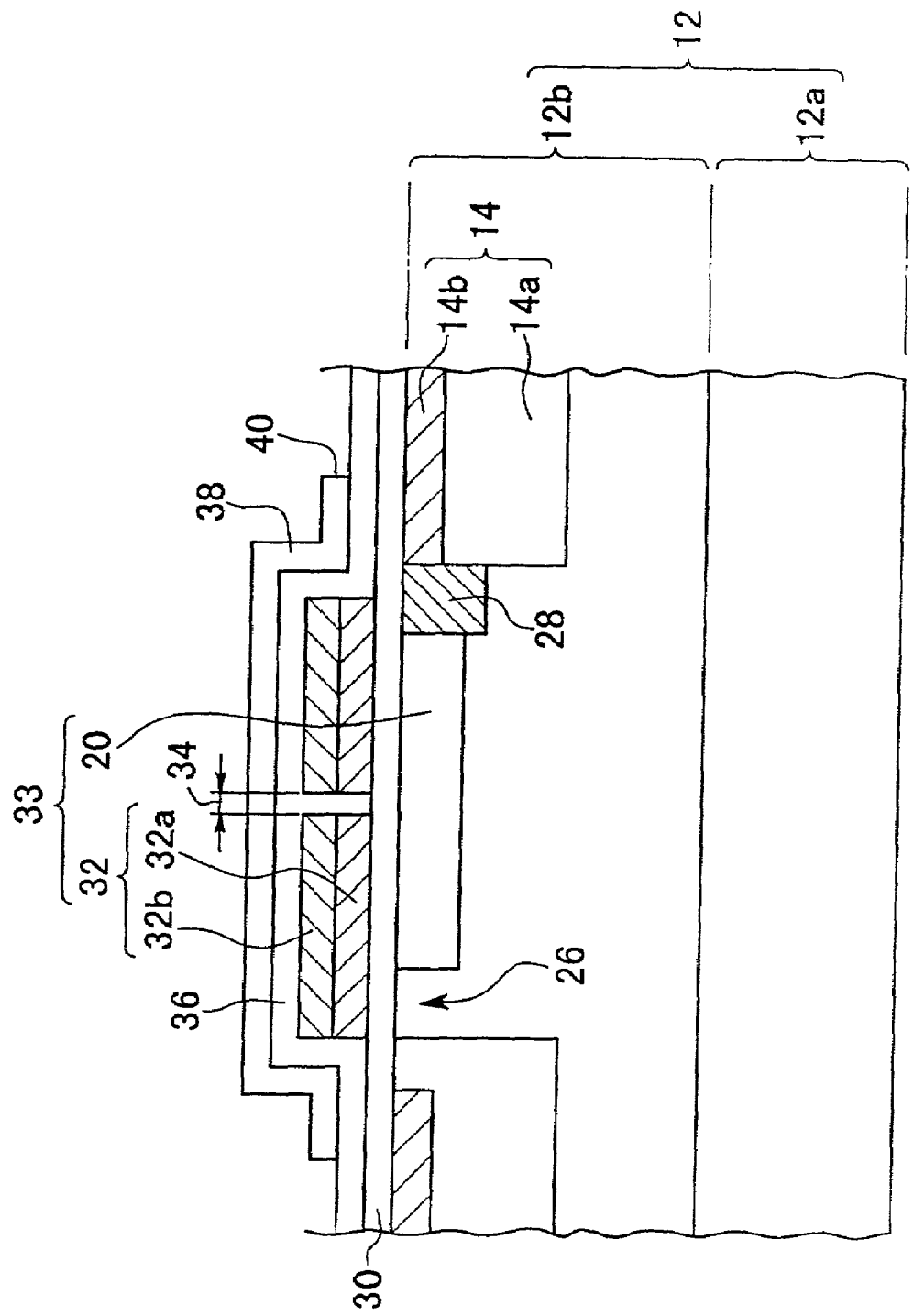
FIG. 6 is a partially sectional view of an image pickup section of a CCD image sensor according to a fourth embodiment.

As illustrated in FIG. 6, the transfer electrode 32 is composed of a multilayered metal thin film in which on a low-resistance polysilicon layer 32a as a first layer is deposited a tungsten silicide (WSi) layer 32b as a second layer. Since the low-resistance polysilicon layer 32a is formed between the WSi layer 32b and the gate oxide film 30, mechanical stress between the WSi layer 32b and the gate oxide film 30 can be reduced. The low-resistance polysilicon can give a precise etching selection ratio easily. Therefore, a precise gap pattern can be formed. Since tungsten silicide (WSi) has a reflectivity lower than that of aluminum (Al), halation does not occur and an image pickup optical system is not affected.

In the case that the transfer electrodes 32 are made of the multilayered metal thin film in this way, functions of relieving of stress, preventing impurity contamination and precise formation of the gap pattern can be given to the metal thin film which is the first layer and functions of making the resistance of the transfer electrodes low, making the reflectivity of the surfaces of the electrodes low, and decreasing invasion of light into the substrate can be given to the metal thin film which is the second layer.

The above-mentioned respective embodiments are examples in which an even number of photoelectric transducer columns are arranged by disposing, in the horizontal direction, a plurality of transducer column groups each of which is composed of the first photoelectric transducer column 16 and the second photoelectric transducer column 18. However, the number of photoelectric transducer columns may be made an odd number by adding or removing one photoelectric transducer column.

The following will describe a process for producing the CCD image sensor according to the fourth embodiment, referring to FIGS. 7A–7G.

Figure 7A:
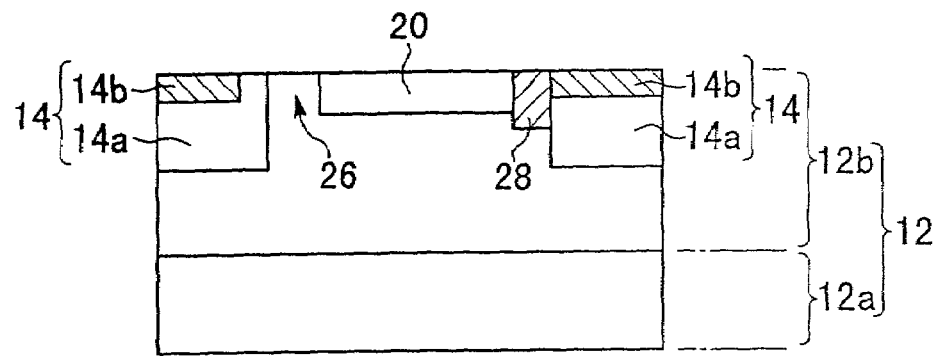
FIGS. 7A–7G are sectional views illustrating a process for producing the CCD image sensor according to the fourth embodiment.

As illustrated in FIG. 7A, the p-type impurity-doped region (p-well) 12b is formed on the silicon n-type semiconductor substrate 12a. The n-type impurity-doped regions 14a are formed at given positions in the p-type impurity-doped region 12b. Furthermore, the $p^+$-impurity-doped (high-concentration p-type impurity-doped) regions 14b are formed in parts of the n-type impurity-doped regions 14a. In this way, the photodiodes 14, which are light-receiving portions, are formed. By adding an n-type impurity to a given position of the p-type impurity-doped region 12b at the side of each of the photodiodes 14, the vertical charge-transfer channel 20 composed of an n-type region having a width of about 0.3 to 0.5 μm is formed. The p-type impurity region is caused to remain at one side (side for reading out charges from the photodiode 14) of the vertical charge-transfer channel 20. Thus, this p-type impurity region becomes the readout gate channel 26. At the other side of the vertical charge-transfer channel 20, the channel stop region 28, which is formed by adding $p^+$-impurity and has a width of, for example, about 0.5 μm, is formed in order to isolate the photodiodes 14 adjacent to each other. In the respective impurity-doped regions, impurity regions having a desired concentration and a desired depth are formed, for example, by ion implantation and subsequent thermal diffusion (annealing).

Figure 7B:
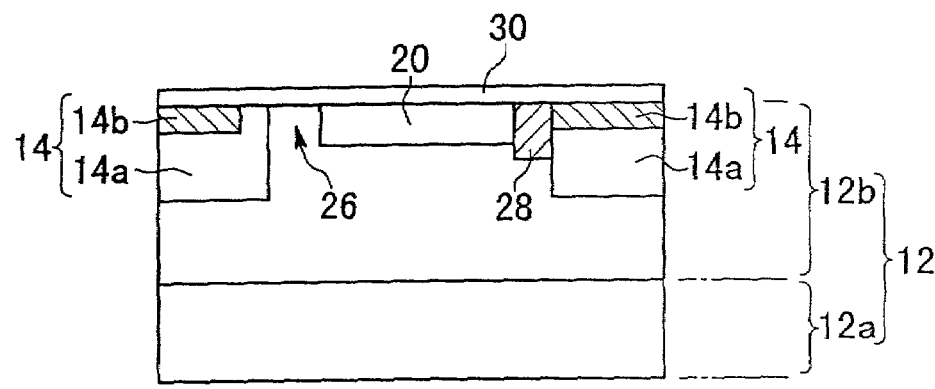
Figure 7C:
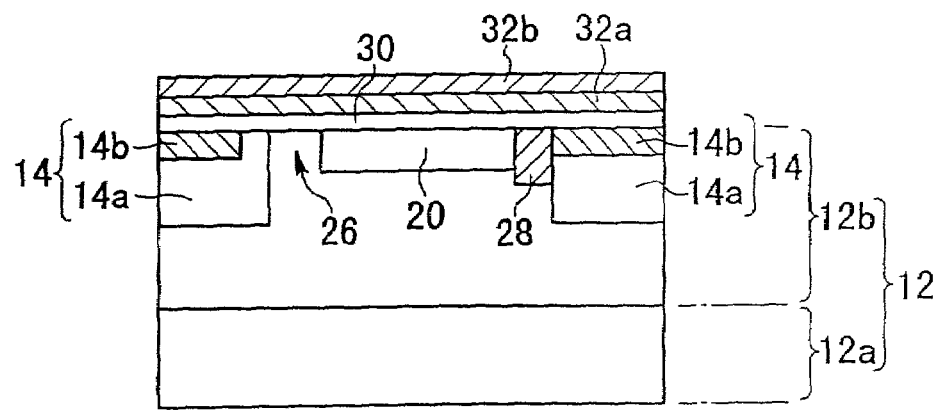

The following will describe the step of forming the monolayer electrodes. Firstly, as illustrated in FIG. 7B, the gate oxide film 30 is formed on the surface of the semiconductor substrate 12. Next, as illustrated in FIG. 7C, polysilicon is deposited on the gate oxide film 30 by chemical vapor deposition (CVD) or the like. Thereafter, phosphorous element is ion-implanted thereto so as to form the low-resistance polysilicon layer 32a. Furthermore, the tungsten silicide (WSi) 32b is deposited on this low-resistance polysilicon layer 32a.

Figure 7D:
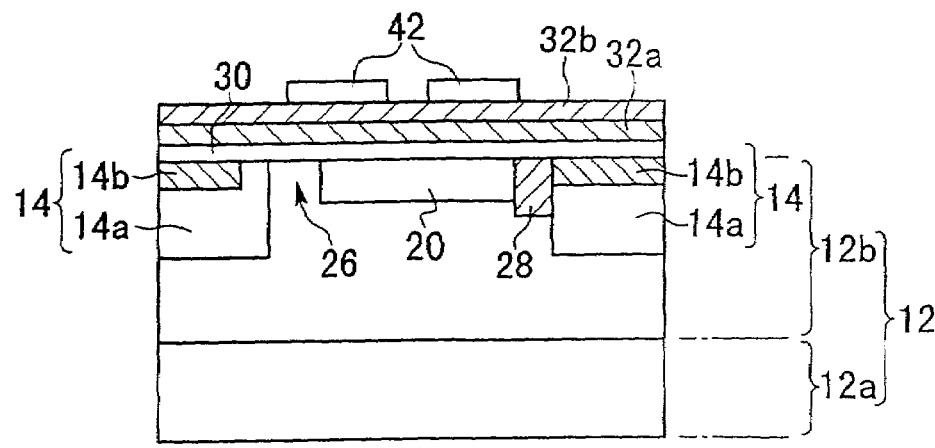

Next, as illustrated in FIG. 7D, a first CVD film 42 is deposited and subsequently a resist pattern having a gap of about 0.6 μm is formed by exposure and development. The remaining resist film is used as a mask to conduct etching treatment, such as plasma etching. In this way, the CVD film 42 is patterned.

Figure 7E:
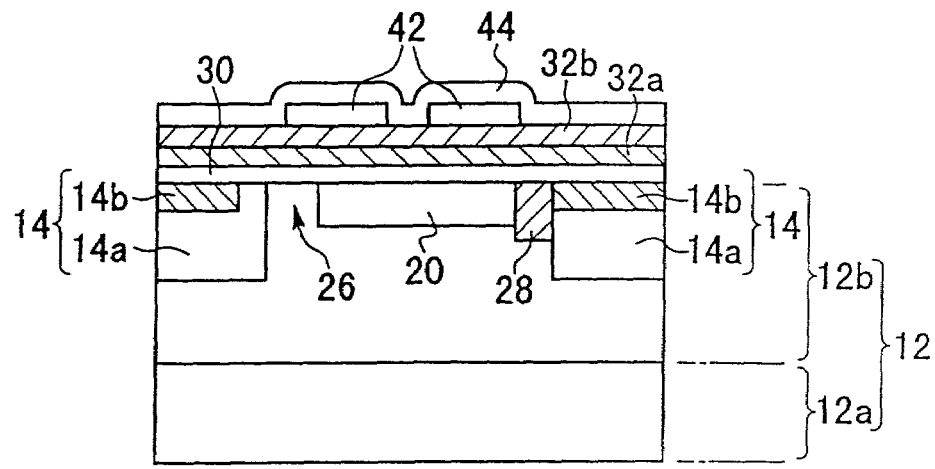
Figure 7F:
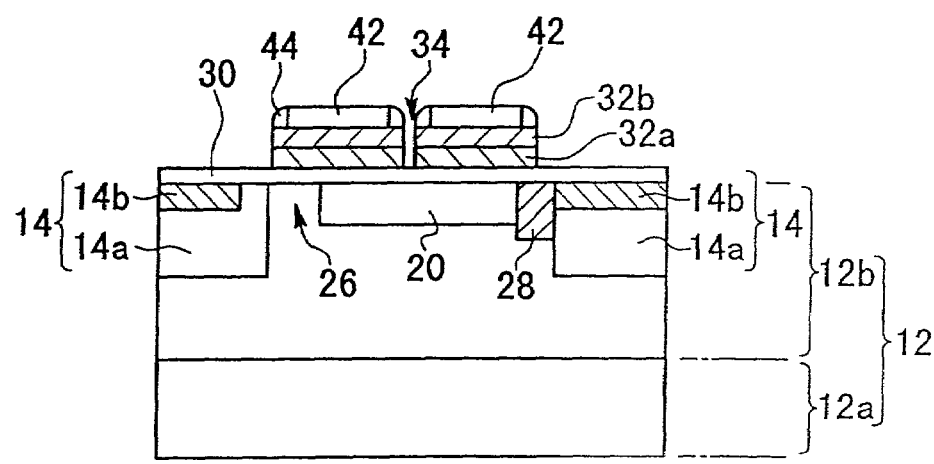

Next, as illustrated in FIG. 7E, a second CVD film 44 is deposited. As illustrated in FIG. 7F, the second CVD film 44 is subjected to etch-back treatment in, for example, an anisotropic dry etching device so as to make a gap having a width of about 0.3 μm in the state that the first CVD film 42 and the second CVD film 44 adhering to the side walls of the first CVD film are caused to remain. The remaining first CVD film 42 and second CVD film 44 are used as a mask to remove the low-resistance polysilicon layer 32a and the WSi layer 32b by etching in the anisotropic dry etching device. In this way, the gap 34 having a width of about 0.3 μm is formed between the electrodes. For the CVD films, silicon oxide ($SiO_2$), silicon nitride ($Si_3N_4$), or the like is preferred.

Figure 7G:
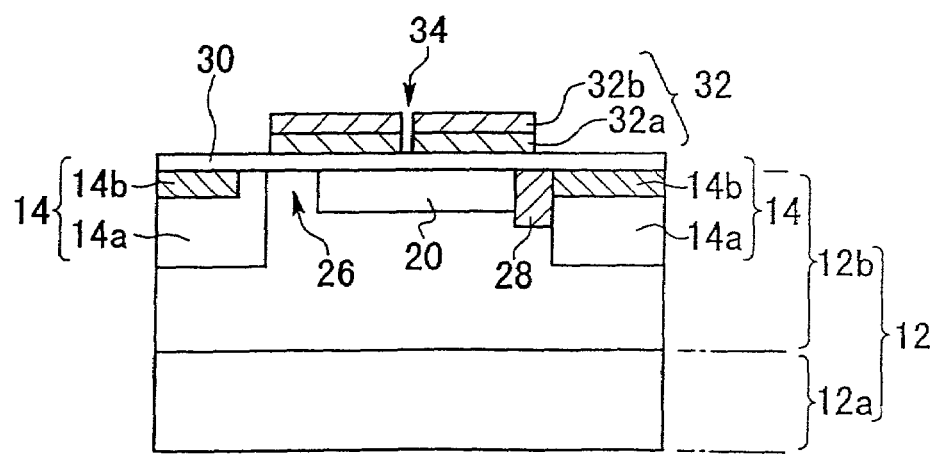

Next, as illustrated in FIG. 7G, all of the remaining first CVD film 42 and second CVD film 44 are removed to form the transfer electrode 32. Boron ions are implanted into the vertical charge-transfer channel 20 below the gap 34 to prevent a potential pocket from being generated in the vertical charge-transfer channel 20 below the gap 34.

In the last step, which is not illustrated, the threshold voltage of transistor portions is adjusted and metal electrodes are formed. The surface of the substrate is then made flat. Thereafter, the color filters and the microlenses are formed to complete a CCD image sensor.

The above-mentioned example is concerned with an example in which side walls of a CVD deposited film are left and transfer electrodes are formed by anisotropic etching technique to have narrow gaps. The example is described in the Journal of Television Society, Vol. 50, No. 2, pp. 234–240 (1996). However, by using a technique for forming a fine pattern using an excimer laser stepper or the like, the pattern of transfer electrodes can be directly formed to have narrow gaps.

Fifth Embodiment

A CCD image sensor according to a fifth embodiment of the present invention is the same as the CCD image sensor according to the first embodiment except that the light-shielding film is not formed to cover the transfer electrodes but is formed across the flattening film, and the color filters are disposed in light-transmitting portions of the light-shielding film. Thus, the same reference numbers are assigned to the same elements, and the description thereof is omitted. Only different points will be described.

As illustrated in FIG. 8, the transfer electrodes 32 are formed on the oxide film 30 and subsequently the surface of the semiconductor substrate 12 is covered with the surface protective film 36 which also functions as the flattening film. On this surface protective film 36 is formed a light-shielding film 56 having red (R) filters 54R, green (G) filters 54G and blue (B) filters 54B (not illustrated), as light-transmitting portions through which light rays (R, G and B) having given wavelengths, which are received in the $p^+$-type impurity-doped regions 14b as light-receiving portions, are transmitted. The respective filters correspond to the respective photodiodes 14. These filters have, for example, an octagonal shape. That is, the R filters, the G filters 54G and the B filters 54B are formed in openings in the light-shielding film 56. Areas which surround the respective color filters composed of the R filters 54R, the G filters 54G and the B filters 54B are made up to the light-shielding portions.

The light-shielding film 56 is made of a nonconductive material such as a resin material. As the resin material, a material containing a photosensitive resin or gelatin as a main material is preferred. For example, by dispersing a pigment which absorbs or reflects visible rays in a resin or by dying a resin with a dye which absorbs or reflects visible rays, the resin material to which light-shielding ability is given can be used. Preferably, the light absorbent (low-reflectivity) material is used. For example, there may be used, a resin material wherein a black pigment is dispersed in a resin, or a resin material wherein a resin is dyed with a black dye. The light-shielding film 56 is extended above the photodiodes 14 and is formed in such a manner that only light rays focused with the microlenses 50 are effectively radiated into the photodiodes 14. Thus, the radiation of unnecessary light rays other than the above-mentioned light rays into the photodiodes 14 is suppressed.

The R filters 54R, the G filters 54G and the B filters 54B are arranged in a given pattern corresponding to the individual photodiodes 14. Detailed description of the arrangement pattern of the color filters is omitted. In FIG. 8, one of the R filters 54R and one of the G filters 54G are illustrated.

The light-shielding film 56 having the color filters can be produced, for example, by forming areas of resins into which dyes or pigments having desired colors are incorporated (color resins) at given positions by photolithography or the like. Its light-shielding portions are made of a light absorbent resin material. The color of the light-shielding portions is generally black. However, the color is not limited to black if the resin material exhibits light absorbance having such a level that can cause a reduction in smears.

A microlens array having a plurality of microlenses 50 is formed across the flattening film 48 above the light-shielding film 56. The microlenses 50 are arranged so as to corresponding to the individual photodiodes 14 as described above.

In the CCD image sensor according to the fifth embodiment, the light-shielding film is not formed to cover the transfer electrodes but is formed across the flattening film, and further the color filters are disposed in light-transmitting portions of the light-shielding film. Therefore, the light-shielding film and the color filters can be formed at the same time. Thus, the process for producing the CCD image sensor can be made simple.

Sixth Embodiment

A CCD image sensor according to a sixth embodiment of the present invention is the same as the CCD image sensor according to the first embodiment except that the light-shielding film is not formed to cover the transfer electrodes but is formed across the flattening film, and the color filters are disposed on the light-shielding film. Thus, the same reference numbers are assigned to the same elements, and the description thereof is omitted. Only different points will be described.

As illustrated in FIG. 9, the surface of the semiconductor substrate 12, above which the transfer electrodes 32 are formed, is covered with the surface protective film 36, which also functions as a flattening film. On this surface protective film 36 is formed a light-shielding film 60 having openings 58 as light-transmitting portions through which light rays received in the $p^+$-type impurity-doped regions 14b as light-receiving portions are transmitted. The respective openings correspond to the respective photodiodes 14. These openings 58 have, for example, an octagonal shape. The light-shielding film 60 is extended above the photodiodes 14 and is formed in such a manner that only light rays focused with the microlenses 50 are effectively radiated into the photodiodes 14. Thus, the radiation of unnecessary light rays other than the above-mentioned light rays into the photodiodes 14 is prevented.

The light-shielding film 60 is made of a nonconductive material such as a resin material. As the resin material, a material containing a photosensitive resin or gelatin as a main material is preferred. For example, by dispersing a pigment which absorbs or reflects visible rays in a resin or by dying a resin with a dye which absorbs or reflects visible rays, the resin material to which light-shielding ability is given can be used. Preferably, the light absorbent (low-reflectivity) material is used. For example, there may be used, for example, a resin material wherein a black pigment is dispersed in a resin, or a resin material wherein a resin is dyed with a black dye. The color of the light-shielding portions is generally black. However, the color is not limited to black if the resin material exhibits light absorbance having such a level that can cause a reduction in smears. The openings 58 are made of a transparent resin.

A color filter array having red (R) filters 46R, green (G) filters 46G and blue (B) filters 46B is formed on the light-shielding film 60. The R filters 46R, the G filters 46G and the B filters 46B are arranged in a given pattern, corresponding to the individual photodiodes 14. Detailed description of the arrangement pattern of the color filters is omitted. In FIG. 9, one of the R filters 46R, one of the G filters 46G and one of the B filters 46B are illustrated.

A microlens array having a plurality of microlenses 50 is formed on the flattening film 48 above the color filter array. The microlenses 50 are arranged so as to corresponding to the individual photodiodes 14 as described above.

In the CCD image sensor according to the sixth embodiment, the light-shielding film is not formed to cover the transfer electrodes but is formed on the flattening film, and further the color filters are disposed on the light-shielding film. Therefore, the color filters can be arranged to be isolated from the photoelectric transducers. Thus, it is unnecessary to be precise in forming the pattern of the color filters. Moreover, it is unnecessary to form resin areas in a plurality of colors inside the light-shielding film. Therefore, a problem of color mixing or color bleeding, especially in dyed color filters, is not caused. Thus, the light-shielding film can easily be produced. The color filters may be disposed beneath the light-shielding film.

The above-mentioned first to sixth embodiments are concerned with examples wherein the arrangement pitch (pixel pitch) of the central positions of the photodiodes positioned in the same column or the same row is constant in all areas of the image pickup section and the arrangement pitch of the central positions of the openings is constant inside all the areas, corresponding to the pixel pitch. However, the pitch of the central positions of the openings may be located off from that of the photodiode, as will be described below.

It is generally known that when an iris of a camera lens in an electronic still camera is opened, the path length and the incident angle of incident light arriving on the image pickup section (light-receiving face) of solid stat image sensor are different in the center (light axial portion) than in the peripheral portion of the image pickup section, whereby the sensitivity of a photographed image gradually deteriorates from the center of the image toward the peripheral portion thereof.

Figure 10:
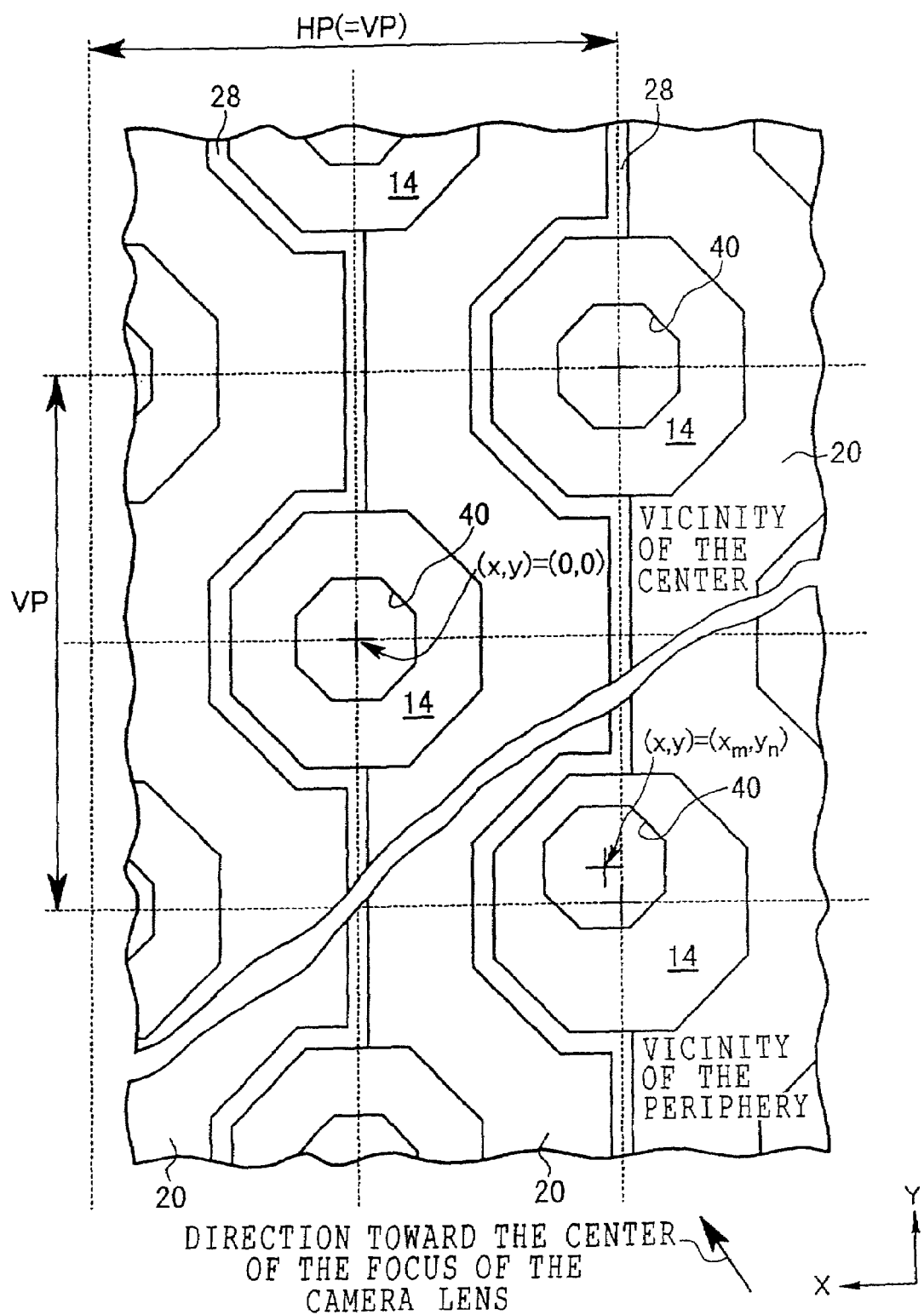
FIG. 10 is a sectional view for explaining the position of photoelectric transducers and the position of openings in a modification example of the present invention.

In an example illustrated in FIG. 10, therefore, the arrangement pitch of the central positions of openings 40 is located off from the center of the solid state image sensor (optical axis center position of the camera lens) toward the peripheral portion of the solid state image sensor (positions apart from the optical axis center position of the camera lens). That is, the arrangement pitch of the central positions of the openings 40 is gradually made smaller from the center of the image pickup section of the solid state image sensor toward the peripheral portions, or is made smaller than the arrangement pitch VP (or HP) of the central positions of the photodiodes 14 by a given distance.

In FIG. 10, coordinates (x, y) are coordinates of the central positions of the openings 40 when the central positions of the corresponding photodiodes 14 are set to the originals. At the center of the image pickup section, which is a cross point of the camera lens and the image pickup section of the CCD image sensor, the coordinates (x, y)=(0, 0). This demonstrates that the central position of the opening 40 is consistent with the central position of the corresponding photodiode 14. On the other hand, in the periphery of the image pickup section, the coordinates (x, y)=($x_m$, $y_n$). This demonstrates that the central position of the opening 40 is shifted from the central position of the corresponding diode 14 by Xm and Yn, respectively, in the X direction and in the Y direction. That is, from the center of the image pickup section (optical axis) toward the peripheral portion thereof, the central positions of the openings 40 become nearer to the optical axis than the central positions of the corresponding photodiodes 14.

By reducing "eclipse" caused by difference in step level by use of monolayer electrodes, and making the arrangement pitch of the central positions of the openings 40 small as described above, from the center of the image pickup section toward the peripheral portion thereof the central positions of the openings are made nearer to the center of the image pickup section than the central positions of the photodiodes. It is therefore possible that light rays which are present at the side nearer to the light axis from the center positions of the photodiodes are radiated into the light-receiving areas. As a result, incident light rays can be effectively introduced into the light-receiving areas, whereby pixels become optically isotropic and sensitivity of the entire solid state image sensors becomes more uniform.

Figure 11:
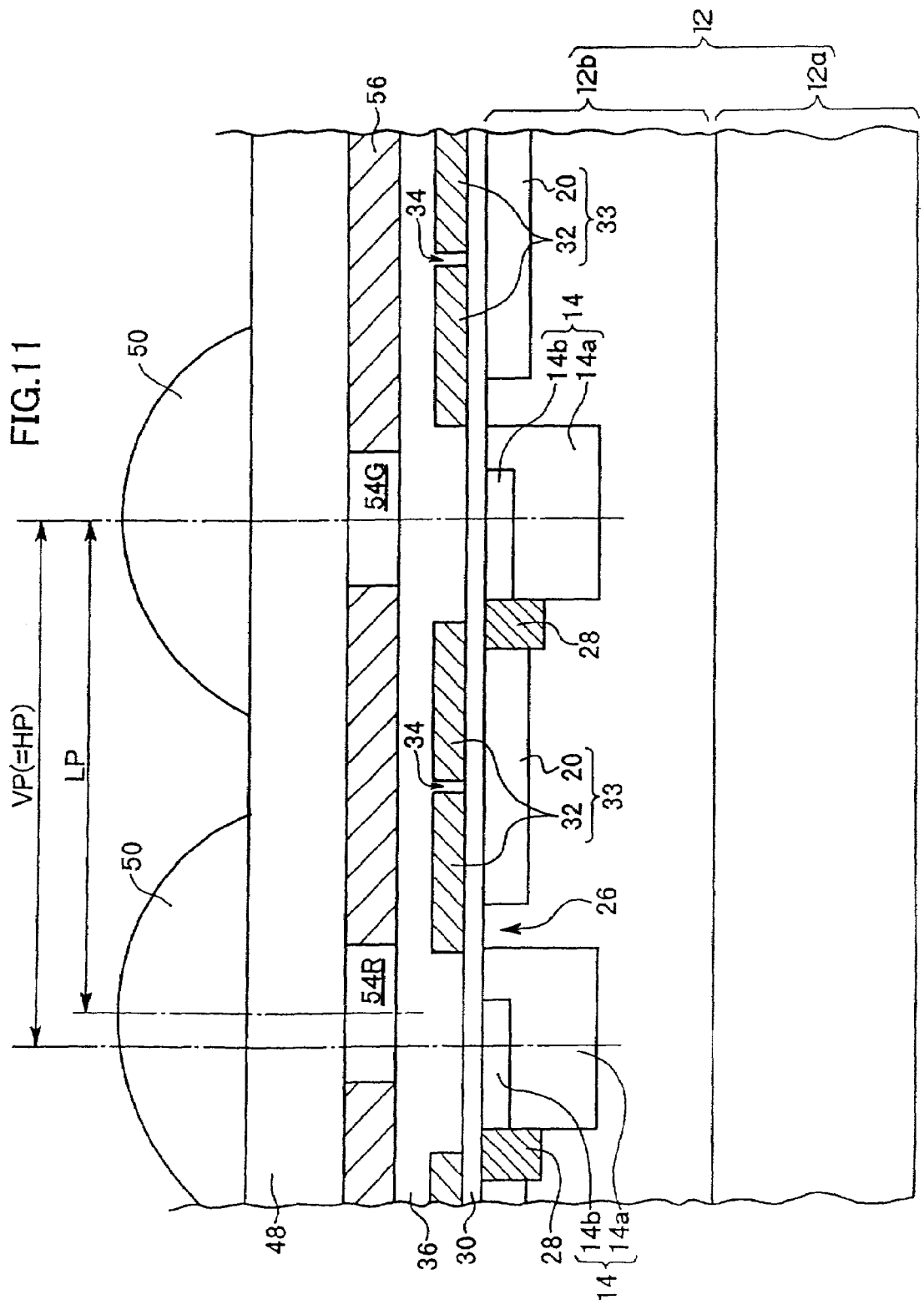
FIG. 11 is a sectional view for explaining the position of openings and the position of microlenses in another modification example of the present invention.
Figure 12A:
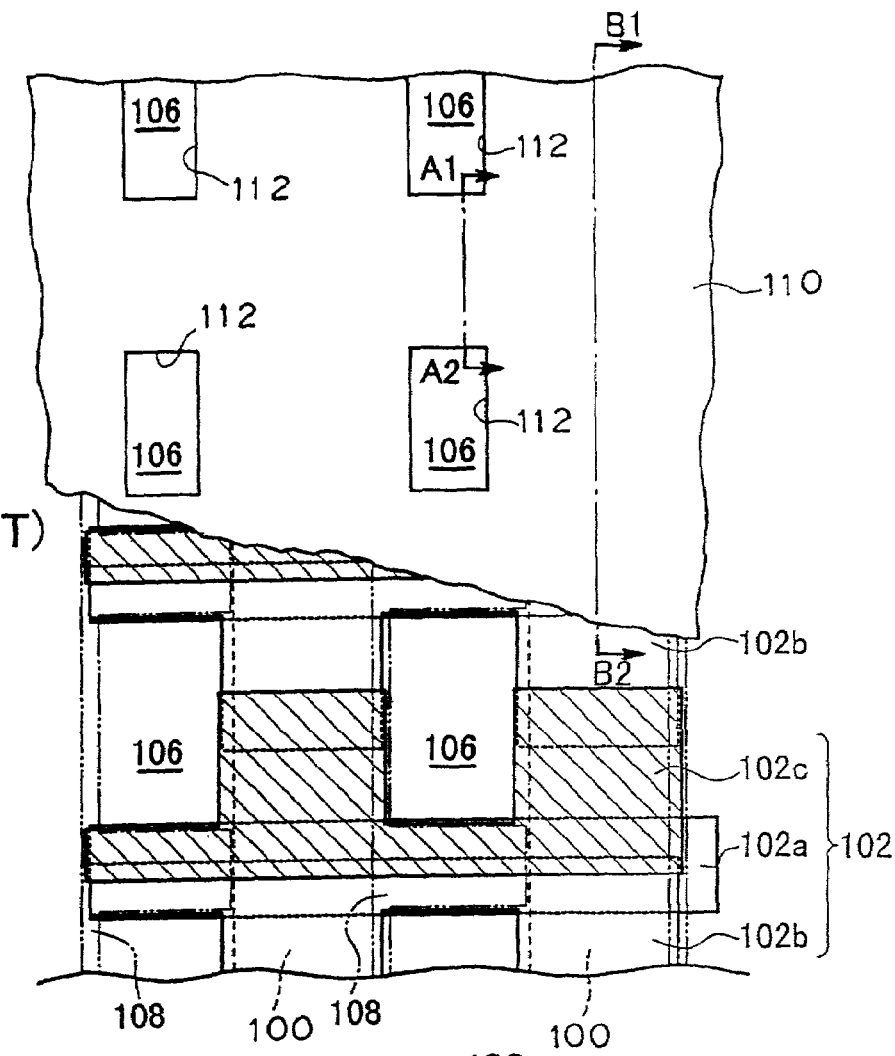
FIG. 12A is a partially enlarged plan view of an image pickup section of a conventional progressive interline CCD.
Figure 12B:
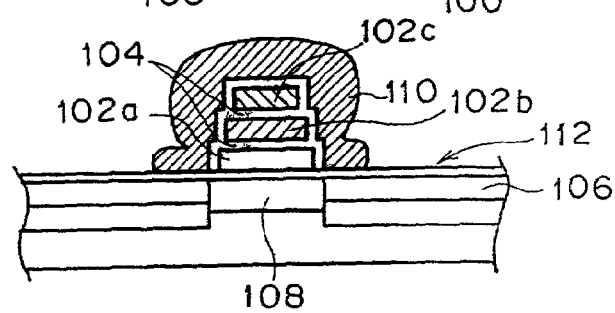
FIG. 12B is a sectional view taken along line A1–A2 of the image pickup section of the conventional progressive interline CCD in FIG. 12A.
Figure 12C:
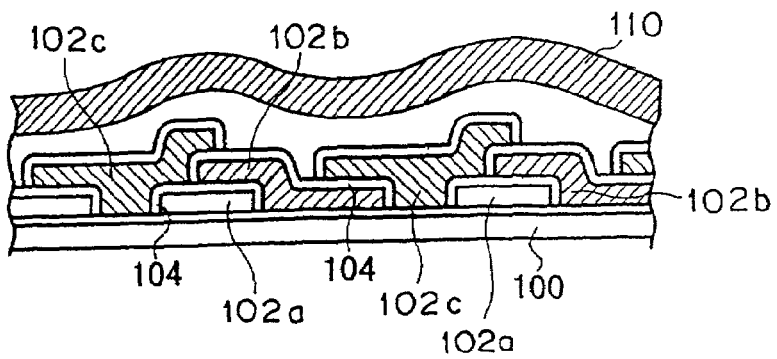
FIG. 12C is a sectional view taken along line B1–B2 of the image pickup section of the conventional progressive interline CCD in FIG. 12A.

As illustrated in FIG. 11, by arranging the microlenses 50 in such a manner that the arrangement pitch LP of the optical axis centers of the microlenses 50 is smaller than the pixel pitch VP, more uniform light sensitivity can be gained.

The above-mentioned first to sixth embodiments have octagonal openings. However, the planar configuration of the openings is not limited to this shape. The planar configuration may be that of a polygon having four or more sides, circular or elliptic.

What is claimed is:

1. A solid state image sensor, comprising a plurality of transducer column groups, each of which is composed of a first photoelectric transducer column wherein a plurality of photoelectric transducers are disposed at given intervals in a given direction, and a second photoelectric transducer column wherein a plurality of photoelectric transducers are disposed at said given intervals in said given direction, the second column being disposed so as to be shifted from the first column by a given amount in said given direction, wherein transfer registers are disposed between the respective photoelectric transducer columns so as to invade spaces between the respective photoelectric transducers in the photoelectric transducer columns adjacent to each other and so as not to contact each other, the solid state image sensor further comprising a plurality of monolayer electrodes which pass between the photoelectric transducers and extend in a direction that intersects said given direction, and which are disposed so as to be a given distance apart from each other in such a manner that signal charges generated in the photoelectric transducers are transferred along the transfer registers, wherein the spacing between the monolayer electrodes above the transfer registers is made narrower than the spacing between the monolayer electrodes above isolation regions for electrically isolating the transfer registers adjacent to each other.

2. A solid state image sensor according to claim 1, wherein the spacing between the monolayer electrodes above the transfer registers is formed in a linear configuration, from one side edge of the transfer registers toward the other side edge of said transfer registers.

3. A solid state image sensor according to claim 1, wherein the reflectivity of the monolayer electrodes is lower than that of metal aluminum itself.

4. A solid state image sensor according to claim 1, wherein the monolayer electrodes are made of any one electrode material selected from the group consisting of low-resistance polysilicon, tungsten, molybdenum, tungsten silicide, molybdenum silicide, titanium silicide, tantalum silicide and copper silicide.

5. A solid state image sensor according to claim 1, wherein the monolayer electrodes are formed by stacking a plurality of electrode materials.

6. A solid state image sensor, comprising a plurality of transducer column groups arranged in parallel, each of which is composed of a first photoelectric transducer column wherein a plurality of photoelectric transducers are disposed at given intervals in a given direction, and a second photoelectric transducer column wherein a plurality of photoelectric transducers are disposed at said given intervals in said given direction, the second column being disposed to be shifted from the first column by a given amount in said given direction,
- wherein transfer registers are disposed between the respective photoelectric transducer columns so as to invade spaces between the respective photoelectric transducers in the photoelectric transducer columns adjacent to each other and so as not to contact each other,
- the solid state image sensor further comprising a plurality of monolayer electrodes which pass between the photoelectric transducers to extend in a direction which intersects said given direction, and which are disposed to sandwich given gaps therebetween in such a manner that signal charges generated in the photoelectric transducers are transferred along the transfer registers, and
- a nonconductive light-shielding film formed above the monolayer electrodes and having light-transmitting portions through which light received in light-receiving areas of the photoelectric transducers is transmitted.
- wherein the spacing between the monolayer electrodes above the transfer registers is made narrower than the spacing between the monolayer electrodes above isolation regions for electrically isolating the transfer registers adjacent to each other.

7. A solid state image sensor according to claim 6, wherein light-transmitting portions through which the light having a given wavelength received in light-receiving areas of the photoelectric transducers is transmitted, and light-shielding portions surrounding the light-transmitting portions are disposed in the same plane of the nonconductive light-shielding film.

8. A solid state image sensor according to claim 6, wherein a filter layer which transmits light of a given wavelength is formed above or below the nonconductive light-shielding film.

9. A solid state image sensor according to claim 6, wherein all or a part of edge portions of the nonconductive light-shielding film is extended toward the center of the light-receiving areas of the photoelectric transducers.

10. A solid state image sensor according to claim 6, wherein the nonconductive light-shielding film is made of a resin material.

11. A solid state image sensor according to claim 10, wherein the resin material contains a photosensitive resin or gelatin.

12. A solid state image sensor according to claim 10, wherein the resin material is a material wherein a pigment which absorbs or reflects visible rays is dispersed in a resin, or a material wherein a resin is dyed with a dye which absorbs or reflects visible rays.

13. A solid state image sensor according to claim 6, wherein the central positions of the light-transmitting portions are off centered from the central positions of the photoelectric transducers.

14. A solid state image sensor according to claim 6, wherein the arrangement pitch of central positions of the light-transmitting portions is made smaller than the arrangement pitch of central positions of the photoelectric transducers.

15. A solid state image sensor according to claim 14, wherein the arrangement pitch of optical axis of microlenses arranged above the light-shielding film is made smaller than the arrangement pitch of central positions of the photoelectric transducers.

* * * * *